(12) United States Patent
Rastogi et al.

(10) Patent No.: US 10,903,213 B2
(45) Date of Patent: *Jan. 26, 2021

(54) INTEGRATED CIRCUIT DEVICES

(71) Applicant: SAMSUNG ELECTRONICS CO., LTD., Suwon-si (KR)

(72) Inventors: Sidharth Rastogi, Hwaseong-si (KR); Subhash Kuchanuri, Hwaseong-si (KR); Raheel Azmat, Suwon-si (KR); Pan-jae Park, Seongnam-si (KR); Chul-hong Park, Seongnam-si (KR); Jae-seok Yang, Hwaseong-si (KR); Kwan-young Chun, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/453,645

(22) Filed: Jun. 26, 2019

(65) Prior Publication Data

US 2019/0326285 A1 Oct. 24, 2019

Related U.S. Application Data

(63) Continuation of application No. 15/603,577, filed on May 24, 2017, now Pat. No. 10,361,198.

(30) Foreign Application Priority Data

Oct. 6, 2016 (KR) .................. 10-2016-0129086

(51) Int. Cl.
*H01L 27/092* (2006.01)
*H01L 27/02* (2006.01)
(Continued)

(52) U.S. Cl.
CPC ............ *H01L 27/092* (2013.01); *H01L 21/76* (2013.01); *H01L 21/76895* (2013.01);
(Continued)

(58) Field of Classification Search
CPC . H01L 27/092; H01L 21/76; H01L 21/76895; H01L 23/535; H01L 27/0207;
(Continued)

(56) References Cited

U.S. PATENT DOCUMENTS 7,681,164 B2 3/2010 Lin et al.
8,766,364 B2 7/2014 Doornbos et al.
(Continued)

*Primary Examiner* — Fernando L Toledo
*Assistant Examiner* — Valerie N Newton
(74) *Attorney, Agent, or Firm* — Lee IP Law, PC

(57) ABSTRACT

An integrated circuit device includes a substrate including a fin active region extending in a first direction, a gate line intersecting the fin active region and extending in a second direction perpendicular to the first direction, a power line electrically connected to source/drain regions at sides of the gate line on the fin active region, a pair of dummy gate lines intersecting the fin active region and extending in the second direction, and a device separation structure electrically connected to the pair of dummy gate lines and including a lower dummy contact plug between the pair of dummy gate lines on the fin active region and electrically connected to the power line, and an upper dummy contact plug on the lower dummy contact plug and on the pair of dummy gate lines to electrically connect the lower dummy contact plug to the pair of dummy gate lines.

17 Claims, 22 Drawing Sheets

(51) Int. Cl.
*H01L 21/76* (2006.01)
*H01L 21/768* (2006.01)
*H01L 23/535* (2006.01)
*H01L 29/06* (2006.01)
*H01L 29/49* (2006.01)
*H01L 29/78* (2006.01)
*H01L 29/417* (2006.01)
*H01L 21/8238* (2006.01)
*H01L 27/118* (2006.01)

(52) U.S. Cl.
CPC ........ *H01L 23/535* (2013.01); *H01L 27/0207* (2013.01); *H01L 27/0924* (2013.01); *H01L 29/0642* (2013.01); *H01L 29/0649* (2013.01); *H01L 29/4966* (2013.01); *H01L 21/823828* (2013.01); *H01L 21/823871* (2013.01); *H01L 29/41791* (2013.01); *H01L 29/785* (2013.01); *H01L 2027/11829* (2013.01)

(58) Field of Classification Search
CPC ............. H01L 27/0924; H01L 29/0642; H01L 29/0649; H01L 29/4966; H01L 21/823828; H01L 21/823871; H01L 29/41791

See application file for complete search history.

(56) References Cited

U.S. PATENT DOCUMENTS

| | | |
|---|---|---|
| 9,006,100 B2 | 4/2015 | Rashed et al. |
| 9,142,513 B2 | 9/2015 | Rashed et al. |
| 9,317,646 B2 | 4/2016 | Lu et al. |
| 9,418,990 B2* | 8/2016 | Azmat ................... H01L 27/088 |
| 10,361,198 B2* | 7/2019 | Rastogi ............. H01L 21/76895 |
| 2014/0077305 A1 | 3/2014 | Pethe et al. |
| 2015/0311082 A1 | 10/2015 | Bouche et al. |
| 2015/0311122 A1 | 10/2015 | Rashed et al. |
| 2015/0340467 A1 | 11/2015 | Bouche et al. |
| 2016/0027769 A1 | 1/2016 | Baek et al. |
| 2016/0035723 A1 | 2/2016 | Wu et al. |
| 2018/0130786 A1* | 5/2018 | Deepak ............... H01L 27/0207 |

* cited by examiner

INTEGRATED CIRCUIT DEVICES

CROSS-REFERENCE TO RELATED APPLICATIONS

This is a continuation application based on pending application Ser. No. 15/603,577, filed May 24, 2017, the entire contents of which is hereby incorporated by reference.

Korean Patent Application No. 10-2016-0129086, filed on Oct. 6, 2016, in the Korean Intellectual Property Office and entitled: "Integrated Circuit Devices and Method of Manufacturing The Same," is incorporated by reference herein in its entirety.

BACKGROUND

1. Field

The inventive concept relates to an integrated circuit device and a method of manufacturing the same, and more particularly, to an integrated circuit device including a device separation structure and a method of manufacturing the same.

2. Description of the Related Art

As electronic products become smaller and thinner, the need for integrating semiconductor devices is growing.

SUMMARY

Embodiments are directed to an integrated circuit device including a substrate that includes a fin active region that extends in a first direction, a gate line that intersects with the fin active region and extends in a second direction that is perpendicular to the first direction and parallel to an upper surface of the substrate, a power line electrically connected to a source/drain region formed at a side of the gate line and on the fin active region disposed, a pair of dummy gate lines that intersect the fin active region, is disposed apart from the gate line and extend in the second direction, and a device separation structure that is electrically connected to the pair of dummy gate lines. The device separation structure includes a lower dummy contact plug that is formed between the pair of dummy gate lines and on the fin active region and electrically connected to the power line, and an upper dummy contact plug that is formed on the lower dummy contact plug and on the pair of dummy gate lines and electrically connect the lower dummy contact plug to the pair of dummy gate lines.

Embodiments are also directed to an integrated circuit device including a substrate that includes a first and second fin active regions being parallel to each other and extending in a first direction, a gate line that intersects with the first and second fin active regions and extends in a second direction that is perpendicular to the first direction and parallel to an upper surface of the substrate, a first dummy gate line that intersects with the first fin active region, is spaced apart from the gate line and extends in the second direction, a power line that extends in the first direction on the substrate, and a device separation structure that is disposed on the first dummy gate line, electrically connects the power line to the first dummy gate line for a dummy transistor including the first dummy gate line to be turned off, and vertically overlaps a portion of the power line.

Embodiments are also directed to an integrated circuit device including a substrate including first and second fin active regions spaced apart on the substrate, the first and second fin active regions having a dummy region therebetween, a gate line crossing the first and second fin active regions and the dummy region, a dummy gate line spaced apart from the gate line in a first direction, the dummy gate line crossing the first fin active region, the dummy gate line crossing the first fin active region, the gate line and the dummy gate line extending in a second direction crossing the first direction, and a device separation structure electrically connecting a power line to the dummy gate line to control a dummy transistor that includes the dummy gate line.

BRIEF DESCRIPTION OF THE DRAWINGS

Features will become apparent to those of skill in the art by describing in detail example embodiments with reference to the attached drawings in which.

DETAILED DESCRIPTION

Figure 1:
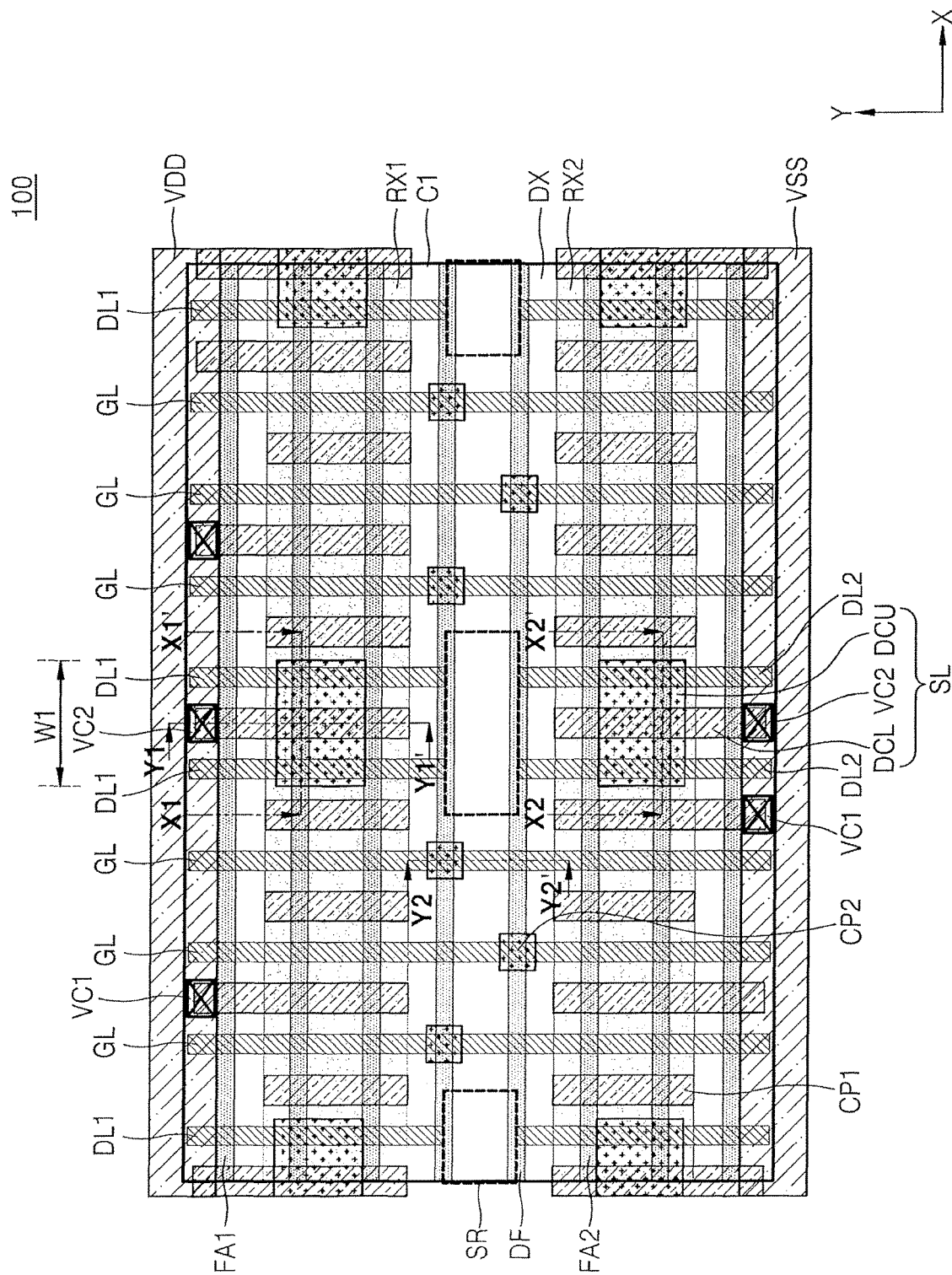
FIG. 1 illustrates a layout diagram showing a configuration of an integrated circuit device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

Figure 2:
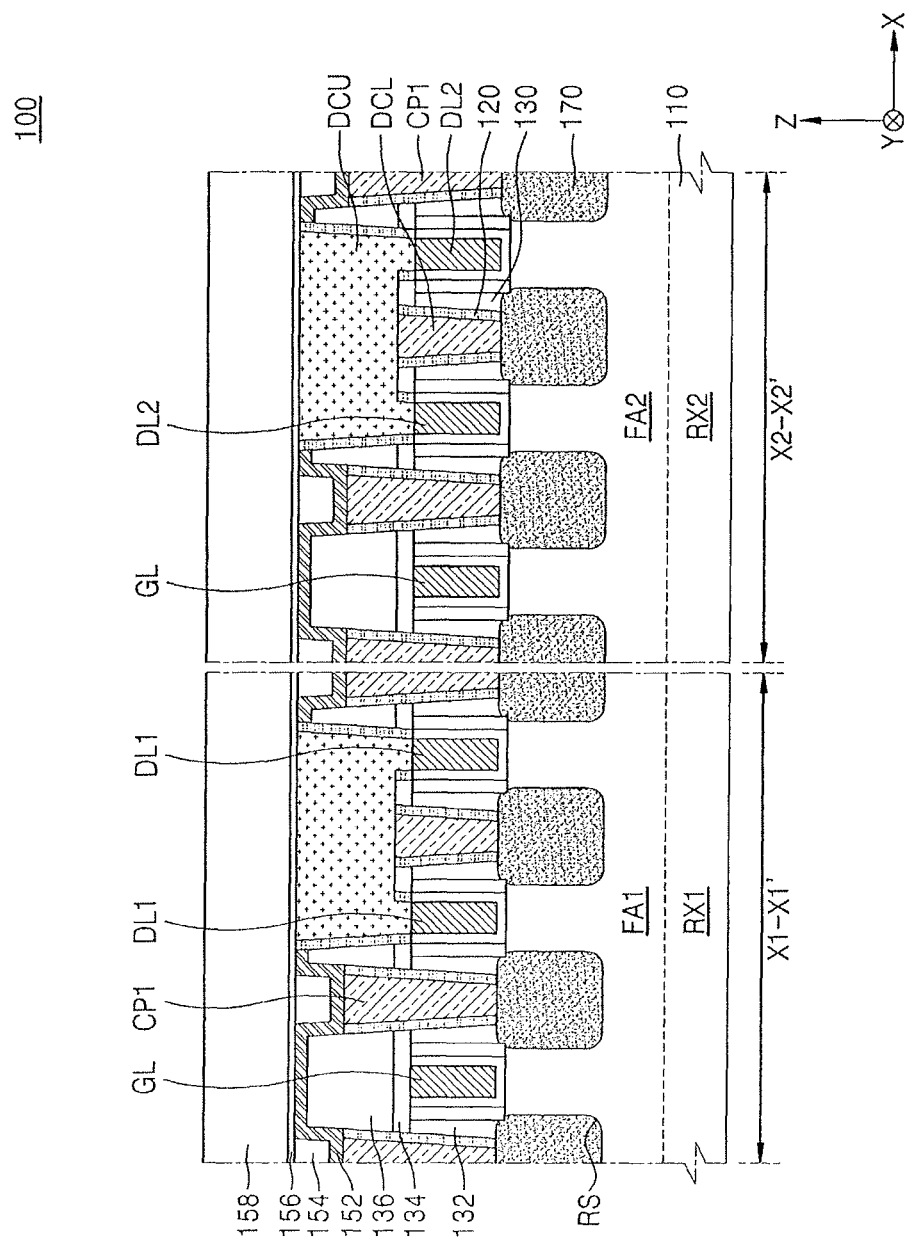
FIG. 2 illustrates a cross-sectional view taken along lines X1-X1' and X2-X2' of the integrated circuit device of FIG. 1.

FIG. 1 is a layout diagram showing a configuration of an integrated circuit device 100 according to an example embodiment. FIG. 2 is a cross-sectional view taken along lines X1-X1' and X2-X2' of the integrated circuit device of FIG. 1, and FIG. 3 is a cross-sectional view taken along lines Y1-Y1' and Y2-Y2' of FIG. 1.

Figure 3:
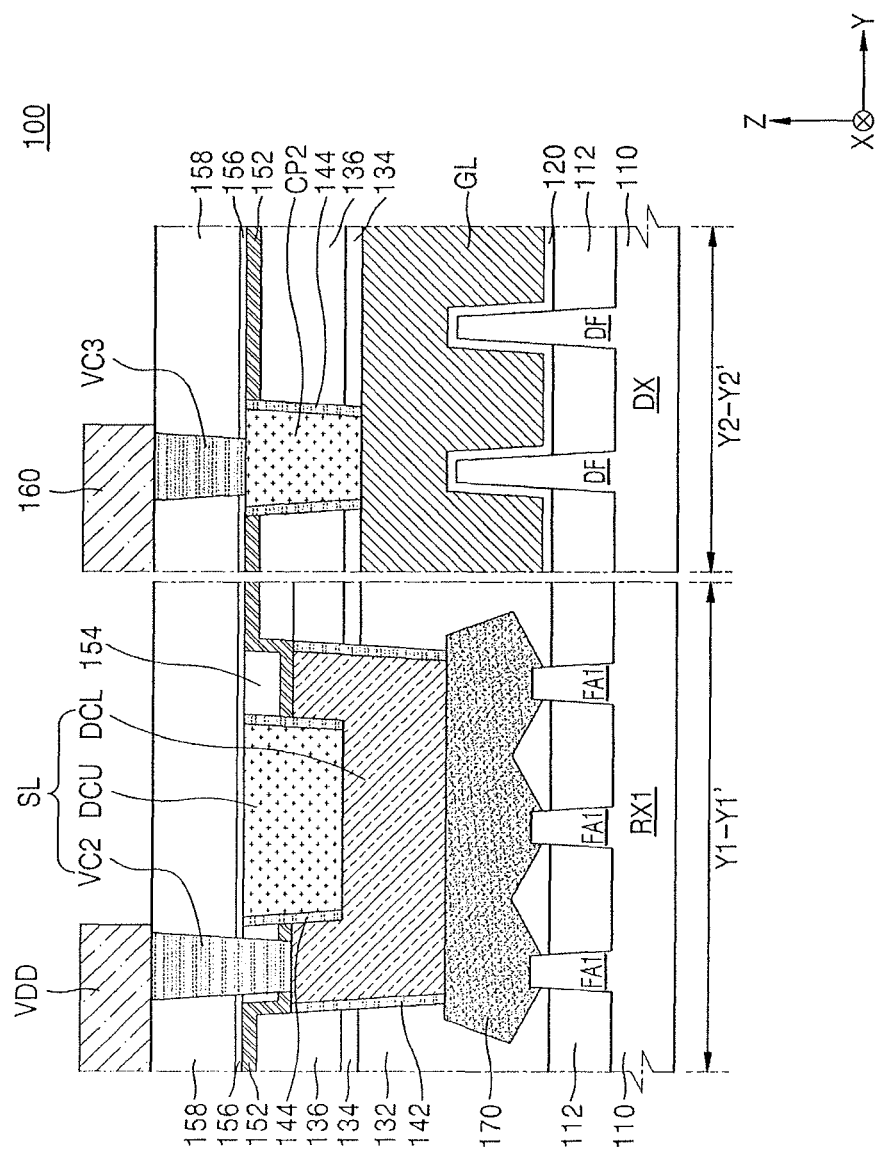
FIG. 3 illustrates a cross-sectional view taken along lines Y1-Y1' and Y2-Y2' of FIG. 1.

Referring to FIGS. 1 to 3, the integrated circuit device 100 may include a substrate 110 in which a cell region C1 is defined by a cell boundary. The cell region C1 may be a region where a logic circuit block having various functions is formed. FIGS. 1 to 3 show example embodiments in which an inverter circuit is formed in the cell region C1. However, the cell region C1 may include other logic circuit blocks such as AND, OR, NOR, or a combination thereof.

The substrate 110 may include a first active region RX1, a second active region RX2 and dummy region DX. The first and second active regions RX1 and RX2 may be arranged a predetermined distance apart from each other, and a dummy region DX may be arranged between the first and second active regions RX1 and RX2. In example embodiments, each of the first and second active regions RX1 and RX2 may respectively include transistors different from each other. For example, a p-type metal-oxide-semiconductor (PMOS) transistor may be formed in the first active region RX1, and an n-type metal-oxide-semiconductor (NMOS) transistor may be formed in the second active region RX2. In another embodiment, same transistors may be formed in both of the first and second active regions RX1 and RX2.

In example embodiments, the substrate 110 may include a semiconductor such as Si or Ge, or a compound semiconductor such as SiGe, SiC, GaAs, InAs, or InP. The substrate 110 may include a conductive region, for example a well doped with impurities, or a structure doped with impurities.

In the first active region RX1 of the substrate 110, a plurality of first fin active regions FA1 may be arranged to protrude from the substrate 110. The first fin active regions FA1 may extend to be parallel to an upper surface of the substrate 110, which is a first direction (X direction of FIG. 1). In the first active region RX1, an isolation layer 112 may be formed between the first fin active regions FA1. The first fin active regions FA1 may protrude from an upper portion of the isolation layer 112 in a fin shape. In the second active region RX2 of the substrate 110, a plurality of second fin active regions FA2 may be arranged to protrude from the substrate 110, and the isolation layer 112 may be formed between the second fin active regions FA2. Selectively, in the dummy region DX, a plurality of dummy fin active regions DF may be arranged to protrude from the substrate 110. The number of the first and second fin active regions FA1 and FA2 and the plurality of dummy fin active regions DF and the interval therebetween are not limited to descriptions in FIG. 1 and may change depending on a function and a capability of a required cell.

In the substrate 110, a plurality of gate insulating layers 120 and a plurality of gate lines GL may extend to intersect the first fin active regions FA1 and the second fin active regions FA2 in a direction (Y direction of FIG. 1). The plurality of gate insulating layers 120 and the plurality of gate lines GL may extend to cover an upper surface and side walls of each of the first and second fin active regions FA1 and FA2 and an upper surface of the isolation layer 112.

A pair of first dummy gate lines DL1 may be arranged apart from the gate lines GL in the substrate 110 and extend in a direction in which the pair of first dummy gate lines DL1 intersect the first fin active regions FA1 (Y direction of FIG. 1). A pair of second dummy gate lines DL2 may be arranged apart from the gate lines GL in the substrate 110 and extend in a direction in which the pair of second dummy gate lines DL2 intersect the second fin active regions FA2 (Y direction).

As described in an example embodiment of FIG. 1, first dummy gate lines DL1 and second dummy gate lines DL2 may be placed on a straight line and be arranged apart from each other in the Y direction, having a dummy gate separation region SR therebetween. The placement thereof may be achieved by a process in which a pair of dummy gate lines are formed to extend to intersect both of the first and second fin active regions FA1 and FA2, a mask that exposes the pair of dummy gate lines in the dummy gate separation region SR is formed, and then the mask is used as an etch mask to remove exposed portions of the dummy gate lines. As a result, the first dummy gate lines DL1 and the second dummy gate lines DL2 may be arranged apart from each other, having the dummy gate separation region SR therebetween and may not be electrically connected to each other.

As described in the example embodiment of FIG. 1, the first dummy gate lines DL1 and the second dummy gate lines DL2 may be formed to extend in the Y direction at a center of the cell region C1 and at left and right edges of the cell region C1. In another implementation, the first and second dummy gate lines DL1 and DL2 formed in the center of the cell region C1 may be omitted.

In example embodiments, the gate insulating layers 120 may include, for example, silicon oxide, a high-k dielectric material, or a combination thereof. The high-k dielectric material may include a material having a dielectric constant greater than that of the silicon oxide. For example, the gate insulating layers 120 may have a dielectric constant in the range of about 10 to 25. The high-k dielectric material may include, for example, a metal oxide or a metal oxynitride. For example, the high-k dielectric material may include one selected from hafnium oxide, hafnium oxynitride, hafnium silicon oxide, lanthanum oxide, lanthanum aluminum oxide, zirconium oxide, zirconium silicon oxide, tantalum oxide, titanium oxide, and a combination thereof, but is not limited thereto. In some embodiments, an interfacial layer may be arranged between the first fin active regions FA1 and the gate insulating layers 120 and between the second fin active regions FA2 and the gate insulating layers 120. The interfacial layer may include an insulating material such as an oxide, a nitride, or an oxynitride.

The gate lines GL and the first and second dummy gate lines DL1 and DL2 may include a work function control metal containing layer and a gap-fill metal layer. The work function control metal containing layer may include, for example, at least one metal selected from Ti, W, Ru, Nb, Mo, Hf, Ni, Co, Pt, Yb, Tb, Dy, Er, and Pd. The gap-fill metal layer may include, for example, W or Al. In example embodiments, each of the gate lines GL and the first and second dummy gate lines DL1 and DL2 may include, for example, a multi-layered structure of TiAlC/TiN/W, a multi-layered structure of TiN/TaN/TiAlC/TiN/W, or a multi-layered structure of TiN/TaN/TiN/TiAlC/TiN/W, etc.

An insulating spacer 130 may be arranged on both side walls of each of the gate lines GL and each of the first and second dummy gate lines DL1 and DL2. The insulating spacer 130 may include, for example, silicon nitride, SiOCN, SiCN, or a combination thereof. In some embodiments, the insulating spacer 130 may include a layer made of a material having a dielectric constant smaller than that of a silicon nitride layer, for example SiOCN, SiCN, or a combination thereof.

A plurality of source/drain regions 170 may be arranged on both sides of each of the gate lines GL in the first and second fin active regions FA1 and FA2. A gate line GL and a source/drain region 170 may be arranged apart from each other, having a gate insulating layer 120 and a insulating spacer 130 therebetween. The plurality of source/drain regions 170 may include an impurity ion injection region formed in some portions of the first and second fin active regions FA1 and FA2, a semiconductor epitaxial layer epitaxially grown from a plurality of recess regions RS that are formed in the first and second fin active regions FA1 and FA2, or a combination thereof. The source/drain regions 170 may include, for example, an epitaxially grown Si layer, an epitaxially grown SiC layer, or a plurality of epitaxially grown SiGe layers. In example embodiments, a transistor formed on the first fin active regions FA1 may be a PMOS transistor, and the source/drain regions 170 formed on both sides of each of the first fin active regions FA1 may include an epitaxially grown SiGe layer and a p-type impurity. In addition, a transistor formed on the second fin active regions FA2 may be an NMOS transistor, and the source/drain regions 170 on both sides of each of the second fin active regions FA2 may include an epitaxially grown Si layer or an epitaxially grown SiC layer and a n-type impurity.

Some portions of the source/drain regions 170 may be covered with an intergate insulating layer 132. The intergate insulating layer 132 may include, for example, silicon oxide.

A first etch stop layer 134 may be formed on the gate lines GL, the first and second dummy gate lines DL1 and DL2 and the intergate insulating layer 132. The first etch stop layer 134 may include, for example, silicon nitride, SiOCN, SiCN, or a combination thereof.

A first interlayer insulating layer 136 may be formed on the first etch stop layer 134. The first interlayer insulating layer 136 may include, for example, silicon nitride, SiOCN, SiCN, or a combination thereof. The first interlayer insulating layer 136 may include a material having an etch selectivity with respect to the first etch stop layer 134.

A plurality of active contact plugs CP1 may be formed at both sides of the gate lines GL and on the first and second fin active regions FA1 and FA2 and may be connected to the source/drain regions 170. The plurality of active contact plugs CP1 may be formed to extend in a direction (Y direction of FIG. 1) in which the active contact plugs CP1 intersect the first and second fin active regions FA1 and FA2. As described in the example embodiment of FIG. 1, the active contact plugs CP1 may be formed on two first and second fin active regions FA1 and FA2 to intersect the two first and second fin active regions FA1 and FA2 in the Y direction. However, unlike in FIG. 1, the active contact plugs CP1 may be formed on three first and second fin active regions FA1 and FA2 to intersect the three first and second fin active regions FA1 and FA2 in the Y direction. A level of an upper surface of each of the active contact plugs CP1 on the first and second fin active regions FA1 and FA2 may be higher than a level of an upper surface of a gate line GL and lower than a level of an upper surface of an adjacent gate contact plug CP2. An active contact plug CP1 may be surrounded by the intergate insulating layer 132, the first etch stop layer 134, and the first interlayer insulating layer 136. A barrier layer 142 may be arranged between the active contact plug CP1 and the intergate insulating layer 132, the first etch stop layer 134, and the first interlayer insulating layer 136. In example embodiments, the active contact plug CP1 may include, for example, tungsten (W) or cobalt (Co), and the barrier layer 142 may include Ti, Ta, TiN, TaN, or a combination thereof.

An insulating liner 152 may be arranged to conformally cover upper surfaces of the active contact plugs CP1 and the first interlayer insulating layer 136. The insulating liner 152 may include, for example, silicon nitride, SiOCN, SiCN, or a combination thereof, and may also include a material having an etch selectivity with respect to the first interlayer insulating layer 136.

A gate contact plug CP2 may be formed on the plurality of gate lines GL. As described in the example embodiment of FIG. 1, the gate contact plug CP2 may be arranged on the dummy fin active region DF in the dummy region DX. However, unlike in FIG. 1, the gate contact plug CP2 may be arranged on the gate line GL in first and second active regions RX1 and RX2. The gate contact plug CP2 may be surrounded by the first etch stop layer 134, the first interlayer insulating layer 136, and the insulating liner 152. A barrier layer 144 may be arranged between the gate contact plug CP2 and the first etch stop layer 134, the first interlayer insulating layer 136, and the insulating liner 152. In example embodiments, the gate contact plug CP2 may include, for example, tungsten (W) or cobalt (Co), and the barrier layer 144 may include, for example, Ti, Ta, TiN, TaN, or a combination thereof.

A buried insulating layer 154 may be formed on the insulating liner 152 arranged on an active contact plug CP1 and a lower dummy contact plug DCL. A level of an upper surface of the buried insulating layer 154 may be the same as levels of upper surfaces of the gate contact plug CP2 and the lower dummy contact plug DCL.

A second etch stop layer 156 may be formed on the gate contact plug CP2 and the insulating liner 152, and a second interlayer insulating layer 158 may be formed on the second etch stop layer 156. The second etch stop layer 156 may be used as an etch stop layer in an etching process of the second interlayer insulating layer 158 to form a gate contact via VC3. The second etch stop layer 156 may include, for example, a silicon nitride layer, a SiOCN layer, a SiCN layer, or a combination thereof. The second interlayer insulating layer 158 may include, for example, a tetraethyl orthosilicate (TEOS) layer, or an ultra-low-k (ULK) layer having a low dielectric constant k in the range of about 2.2 to 2.4. The ULK layer may include, for example, a SiOC layer or a SiCOH layer.

The gate contact via VC3 may be connected to the gate contact plug CP2 through the second interlayer insulating layer 158 and the second etch stop layer 156. A wiring layer 160 connected to the gate contact via VC3 may be formed on the second interlayer insulating layer 158. In FIG. 3, for the convenience sake, the wiring layer 160 is described to have a single-layer structure, but the wiring layer 160 may have a multi-layered structure including a plurality of conductive lines that have various levels and a plurality of conductive vias that connect the plurality of conductive lines to each other.

A first power line VDD and a second power line VSS may be arranged on the second interlayer insulating layer 158. The first power line VDD may be connected to a first fin active region FA1 in the first active region RX1 to apply a drain voltage Vdd (or power voltage) to the first fin active region FA1. The second power line VSS may be connected to a second fin active region FA2 in the second active region RX2 to apply a source voltage Vss (or ground voltage) to the second fin active region FA2. In FIG. 1, the first and second power lines VDD and VSS are described as extending in parallel to a direction in which the first and second fin active regions FA1 and FA2 extend (X direction of FIG. 1). However, the direction in which the first and second power lines VDD and VSS extend is not limited thereto. As described with reference to the wiring layer 160, the first and second power lines VDD and VSS may also be formed to have a single-layer structure or a multi-layered structure.

Device separation structures SL may be formed on a pair of first dummy gate lines DL1 that intersect the first fin active region FA1, and on a pair of second dummy gate lines DL2 that intersect the second fin active region FA2. Each of the device separation structures SL may include a lower dummy contact plug DCL, an upper dummy contact plug DCU and a dummy contact via VC2. The device separation structures SL may be configured to turn off a pair of dummy transistors formed by the pair of first dummy gate lines DL1 and the pair of second dummy gate lines DL2. Therefore, without any physical separation or isolation between the first and second fin active regions FA1 and FA2 (for example, without any electrically insulating materials between the first and second fin active regions FA1 and FA2), the first and second fin active regions FA1 and FA2 may be electrically separated or isolated.

Hereinafter, descriptions of the device separation structure SL in the first active region RX1 will be provided.

In the first active region RX1, the lower dummy contact plug DCL may extend in a direction in which the lower dummy contact plug DC intersects with the first fin active region FA1 on the source/drain region 170 arranged between the first dummy gate lines DL1 (Y direction of FIG. 1). In example embodiments, the lower dummy contact plug DCL may be formed in the same process used to form the active contact plugs CP1 and may include the same material as the active contact plugs CP1. For example, the lower dummy contact plug DCL may include tungsten (W) or cobalt (Co), and the barrier layer 142 surrounding an external wall of the lower dummy contact plug DCL may further be formed.

In example embodiments, as illustrated in FIG. 1, the lower dummy contact plug DCL may extend to intersect three first fin active regions FA1 in the Y direction, and an end portion of the lower dummy contact plug DCL may extend to overlap the first power line VDD. The drain voltage Vdd, applied from the first power line VDD to a source/drain region 170 through an active contact via VC1 and an active contact plug CP1, may also be applied to the lower dummy contact plug DCL. Accordingly, the device separation structure SL may be formed to have a relatively small width W1, and the device separation structure SL may be provided without an increase of a cell area. Characteristics of the lower dummy contact plug DCL on the cell area will be described below.

In another embodiment, differently from descriptions in FIG. 1, the end portion of the lower dummy contact plug DCL may not extend to overlap the first power line VDD, and the lower dummy contact plug DCL may be electrically connected to the first power line VDD through a plurality of wiring layers and a plurality of via structures (not shown).

The upper dummy contact plug DCU may be formed on the pair of first dummy gate lines DL1 and the lower dummy contact plug DCL to contact both the pair of first dummy gate lines DL1 and the lower dummy contact plug DCL. An external wall of the upper dummy contact plug DCU may be surrounded by the first etch stop layer 134, the first interlayer insulating layer 136 and the insulating liner 152.

The upper dummy contact plug DCU may have a first bottom surface and a second bottom surface that has a different level from the first bottom surface. The first bottom surface may contact upper surfaces of the first dummy gate lines DL1, and the second bottom surface may contact an upper surface of the lower dummy contact plug DCL. As illustrated in FIG. 2, a level of the upper surface of the lower dummy contact plug DCL may be higher than levels of the upper surfaces of the first dummy gate lines DL1, and thus, a level of the first bottom surface of the upper dummy contact plug DCU may be lower than a level of the second bottom surface thereof.

In example embodiments, the upper dummy contact plug DCU may be formed in the same process as the gate contact plug CP2 and include the same material as the gate contact plug CP2. For example, the upper dummy contact plug DCU may include tungsten (W) or cobalt (Co), a barrier layer 144 surrounding an external wall of the upper dummy contact plug DCU may further be formed.

The dummy contact via VC2 may be disposed on the lower dummy contact plug DCL. The dummy contact via VC2 may be configured to be connected to the first power line VDD and to apply the drain voltage Vdd to the device separation structure SL. The dummy contact via VC2 may be disposed to vertically overlap the first power line VDD. The dummy contact via VC2 may be formed to have a multi-layered structure of a metal layer and a conductive barrier layer. The metal layer may include, for example, W or Co, and the conductive barrier layer may include, for example, Ti, Ta, TiN, TaN, or a combination thereof.

In the second active region RX2, the lower dummy contact plug DCL may extend in a direction in which the lower dummy contact plug DCL intersects with the second fin active region FA2 on the source/drain region 170 arranged between the second dummy gate lines DL2 (Y direction of FIG. 1), and the upper dummy contact plug DCU may be formed on the pair of second dummy gate lines DL2 and the lower dummy contact plug DCL to contact both the pair of second dummy gate lines DL2 and the lower dummy contact plug DCL. The dummy contact via VC2 may be arranged on the lower dummy contact plug DCL. The dummy contact via VC2 may be configured to be connected to the second power line VSS and to apply the source voltage Vss to the device separation structure SL.

As described above, the device separation structures SL may electrically connect the pair of first dummy gate lines DL1 to the first power line VDD and may also electrically connect the pair of second dummy gate lines DL2 to the second power line VSS. When the first fin active region FA1 is a PMOS transistor region and the drain voltage Vdd is applied from the first power line VDD to the pair of first dummy gate lines DL1, a pair of first dummy transistors including the pair of first dummy gate lines DL1 and the source/drain regions 170 disposed at both sides of the pair of first dummy gate lines DL1 may be turned off. Accordingly, the first fin active region FA1 under the pair of first dummy gate lines DL1 may serve as an electrically insulating structure. When the second fin active region FA2 is an NMOS transistor region and the source voltage Vss (ground voltage or negative voltage level) is applied from the second power line VSS to the pair of second dummy gate lines DL2, a pair of second dummy transistors including the pair of second dummy gate lines DL2 and the source/drain regions 170 disposed at both ends of the pair of second dummy gate lines DL2 may be turned off. Accordingly, the second fin active region FA2 under the pair of second dummy gate lines DL2 may serve as an electrically insulating structure.

The first and second fin active regions FA1 and FA2 that intersect the device separation structures SL may respectively have upper surfaces that continuously extend throughout the cell region C1. For example, as illustrated in FIG. 1, the cell region C1 may include the first fin active regions FA1 and the second fin active regions FA2 that may extend to the whole width of the cell region C1 in the first direction (X direction) (for example, a length with respect to the X direction of the cell region C1). The pair of first dummy gate lines DL1 and the pair of second dummy gate lines DL2 may be arranged to extend in a second direction (Y direction) at the center of the cell region C1, and the gate lines GL extending in the Y direction may be arranged on a left side and a right side of the cell region C1 while having the pair of the first dummy gate lines DL1 and the pair of second dummy gate lines DL2 therebetween. Accordingly, the first and second fin active regions FA1 and FA2 may have upper surfaces that continuously extend from the left side to the right side of the cell region C1 without any physical separations. Thus, the first and second fin active regions FA1 and FA2 in the left side of the cell region C1 may be electrically separated from the first and second fin active regions FA1 and FA2 in the right side of the cell region C1, having the pair of first dummy gate lines DL1 and the pair of second dummy gate lines DL2 in the middle of the cell region C1.

Generally, in order to electrically separate portions of a fin active region from each other, a mask may be formed on the fin active region and the fin active region is etched by using the mask to form a trench having a predetermined depth. Then, the trench may be filled with an electrically insulating material so that the fin active region is divided into a plurality of fin active regions having a reduced length and separated from each other. The plurality of fin active regions may thus be electrically insulated or isolated from each other by the electrically insulating material. In the present disclosure, a method of separating a fin active region by using an electrically insulating material is referred to as a physical separation scheme. As an integrated circuit device is downscaled, a width and a length of a fin active region are decreased and a patterning process of the decreased fin active region may become hard to accurately control. Thus, if a physical separation scheme using the patterning process were to be used, a window or a variation in a size of each of a plurality of fin active regions may be increased. Additionally, windows or variations of tensile or compressive stress applied to the plurality of fin active regions may be increased. In this regard, electrical characteristics may be degraded, for example, threshold voltages of devices formed in the fin active regions may vary or a carrier mobility of the devices may vary (or a window in threshold voltages or carrier mobility of the device may be increased).

However, according to example embodiments, the device separation structures SL are connected to the pair of first dummy gate lines DL1 and the pair of second dummy gate lines DL2, and the drain voltage Vdd and the source voltage Vss that turn off the pair of dummy transistors may be applied to the pair of first dummy gate lines DL1 and the pair of second dummy gate lines DL2 to provide a device separation region in the first and second fin active regions FA1 and FA2. Thus, degradation of electrical characteristics of devices that may occur when the physical separation scheme is used may be prevented.

In addition, an integrated circuit device using an electrical separation scheme may employ a method in which a gate line and a source/drain region adjacent to the gate line are electrically disconnected through a gate strip. In this case, an additional connection structure for connecting the gate strip to a power line is formed at a side portion of a cell region and thus, a relatively large area is required for the electrical separation scheme.

However, the device separation structures SL according to example embodiments may be formed on the pair of first dummy gate lines DL1 and the pair of second dummy gate lines DL2, and the width W1 of the device separation structures SL may be smaller than twice of a pitch of the gate lines (or contact poly pitch CPP (not shown)). The lower dummy contact plug DCL may be arranged to partly overlap the first and second power lines VDD and VSS and thus, a relatively small area for forming each of the device separation structures SL may be required.

Therefore, according to the embodiment of the integrated circuit device 100, even when the fin active regions are not physically separated from each other, an electrical disconnection between cells may be provided in a stable manner by using the device separation structures SL. Also, each of the device separation structures SL may be formed in a relatively small area and thus, the integrated circuit device 100 may be provided in a compact manner.

Figure 4:
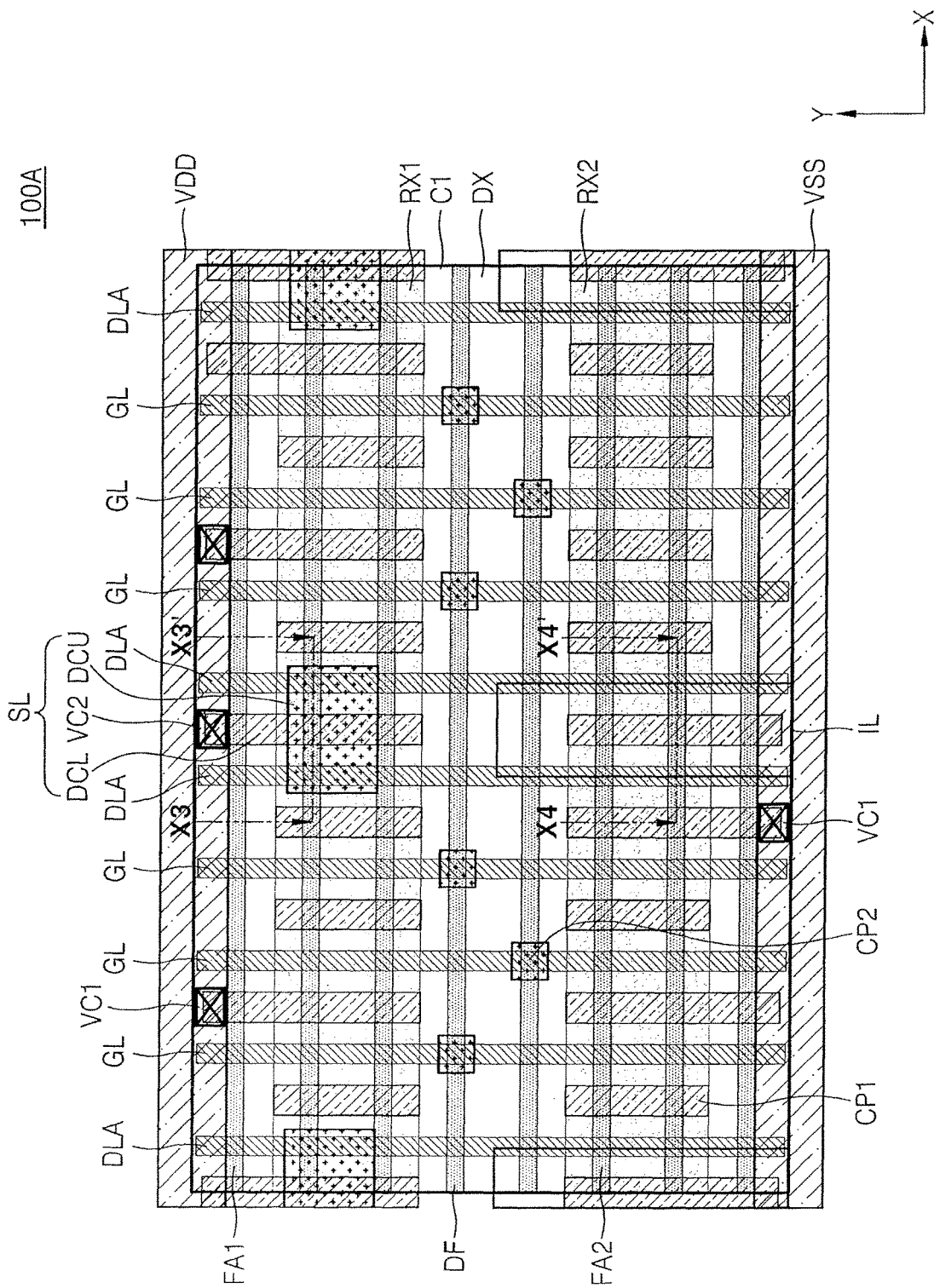
FIG. 4 illustrates a layout diagram showing a configuration of an integrated circuit device according to an example embodiment.
Figure 5:
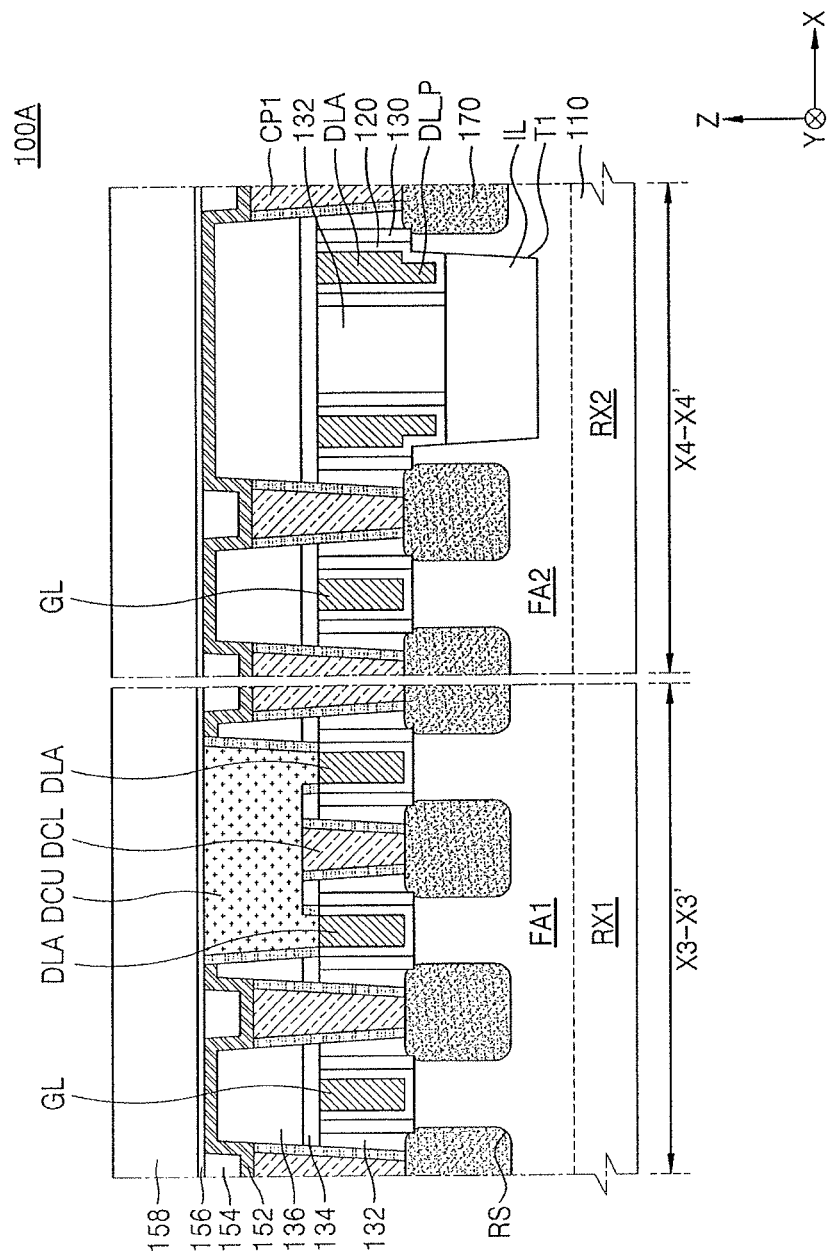
FIG. 5 illustrates a cross-sectional view taken along lines X3-X3' and X4-X4' of the integrated circuit device of FIG. 4.

FIG. 4 is a layout diagram showing a configuration of an integrated circuit device 100A according to example embodiments. FIG. 5 is a cross-sectional view taken along lines X3-X3' and X4-X4' of the integrated circuit device 100A of FIG. 4. In FIGS. 1 and 5, like reference numerals may denote like elements.

The integrated circuit device 100A is similar to the integrated circuit device 100 in FIGS. 1 to 3, except that a device separation structure SL is formed only on a first active region RX1 and an insulating layer structure IL is formed on a second active region RX2. Therefore, differences between the integrated circuit device 100A and the integrated circuit device 100 will only be described below.

Referring to FIGS. 4 and 5, the insulating layer structure IL may be formed on the second active region RX2. The insulating layer structure IL may be disposed under a pair of dummy gate lines DLA and extend to a dummy region DX in a direction in which the pair of dummy gate lines DLA extend (Y direction of FIG. 4). As illustrated in FIG. 5, the insulating layer structure IL may have an upper surface having a lower level than a level of an upper surface of a second fin active region FA2 and a protrusion portion DL_P may be formed at bottom portions of the pair of dummy gate lines DLA arranged on the insulating layer structure IL. In another embodiment, differently from descriptions in FIG. 5, the insulating layer structure IL may have an upper surface having a higher level than or the same level as a level of the upper surface of the second fin active region FA2, and the bottom surfaces of the dummy gate lines DLA, which are positioned on the insulating layer structure IL, may have a higher level or the same level as a level of bottom surfaces of dummy gate lines DLA, which are positioned on a first fin active region FA1.

In an example process for forming the insulating layer structure IL, a mask having an opening and extending in the Y direction may be formed on the second fin active region FA2, an area of the fin active region FA2 that is exposed by the opening may be removed to form a trench T1 extending in the Y direction and having a predetermined depth, and then the trench T1 may be filled with an insulating material to form the insulating layer structure IL. Selectively, a recess process may be performed to further remove an upper portion of the insulating layer structure IL in the trench T1 by the predetermined height so that the upper surface of the insulating layer structure IL may have a lower level than a level of the upper surface of the second fin active region FA2 as illustrated in FIG. 5.

In example embodiments, insulating layer structure IL may include an oxide layer formed by, for example, a flowable chemical vapor deposition (FCVD) process or a spin coating process. For example, the insulating layer structure IL may include a fluoride silicate glass (FSG), an undoped silicate glass (USG), a boro-phospho-silicate glass (BPSG), a phospho-silicate glass (PSG), a flowable oxide (FOX), a plasma enhanced tetra-ethyl-ortho-silicate (PE-TEOS), or a tonen silazene (TOSZ), etc.

Selectively, a liner may further be formed between the second fin active region FA2 and the insulating layer structure IL. In example embodiments, the liner may include an oxide layer formed in an oxidation process in which an area of second fin active region FA2 exposed by the trench T1 is oxidized, and the oxidation process may include, for example, an in-situ steam generation (ISSG) process, a heat oxidation process, a UV oxidation process, or an $O_2$ plasma oxidation process.

In example embodiments, the first fin active region FA1 may be a PMOS transistor region, the second fin active region FA2 may be an NMOS transistor region. In a case of a PMOS transistor, an electrical performance of a device may be improved as an amount of compressive stress applied to a fin active region is increased. In a case of an NMOS transistor, an electrical performance of a device may be improved as an amount of tensile stress applied to a fin active region is increased. However, when an insulating layer structure is formed in a region where the PMOS transistor is formed, an amount of the compressive stress applied to the fin active region may be significantly decreased and may degrade an electrical performance of the PMOS transistor. According to embodiments described above, an electrical separation structure using the device separation structure SL may be provided to the first fin active region FA1 in a PMOS transistor region, and a physical separation structure using the insulating layer structure IL may be provided to the second fin active region FA2 in an NMOS transistor region. Thus, the integrated circuit device 100A may present an electrical performance optimized based on a type of a transistor device.

Figure 6:
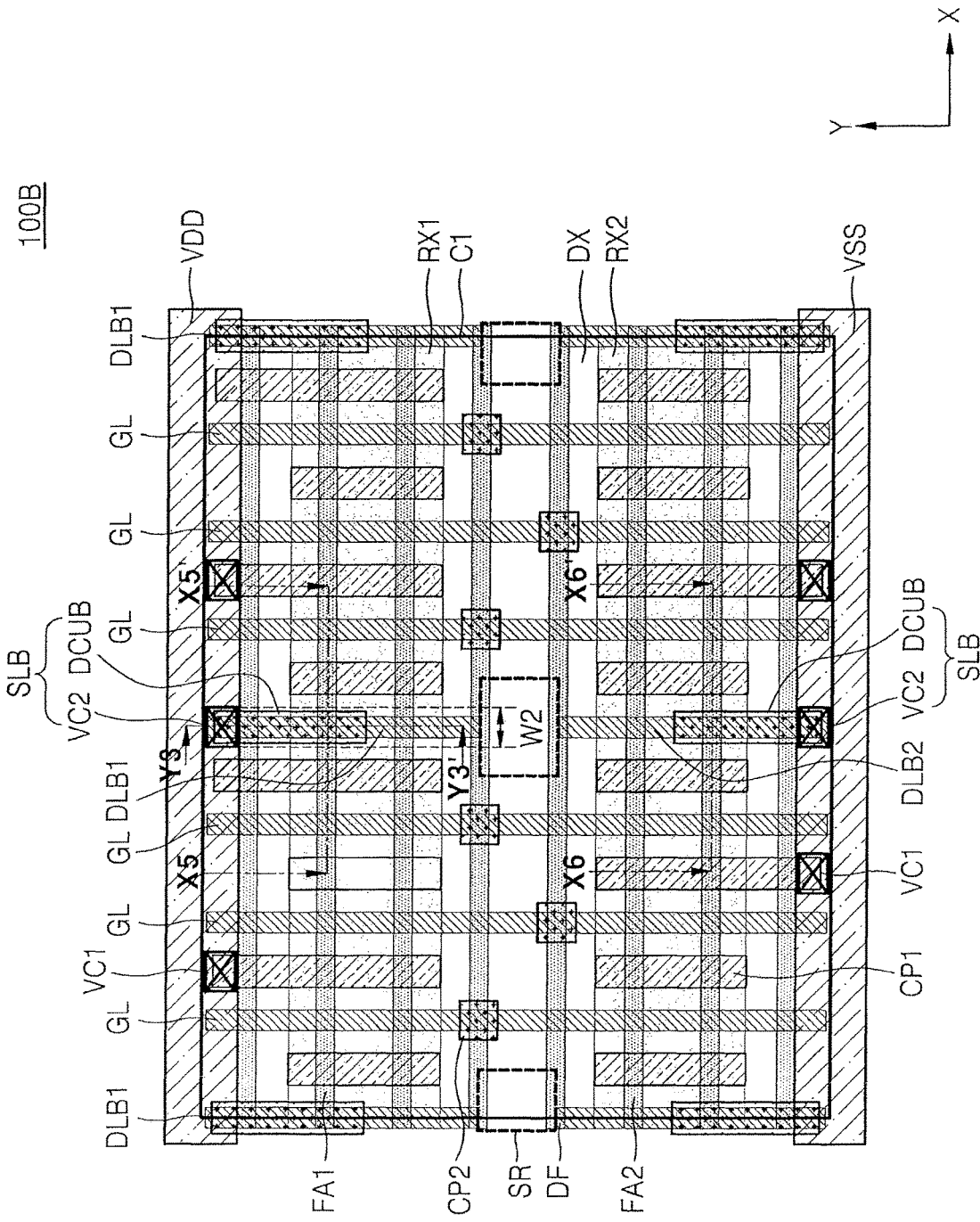
FIG. 6 illustrates a layout diagram showing a configuration of an integrated circuit device according to an example embodiment.
Figure 7:
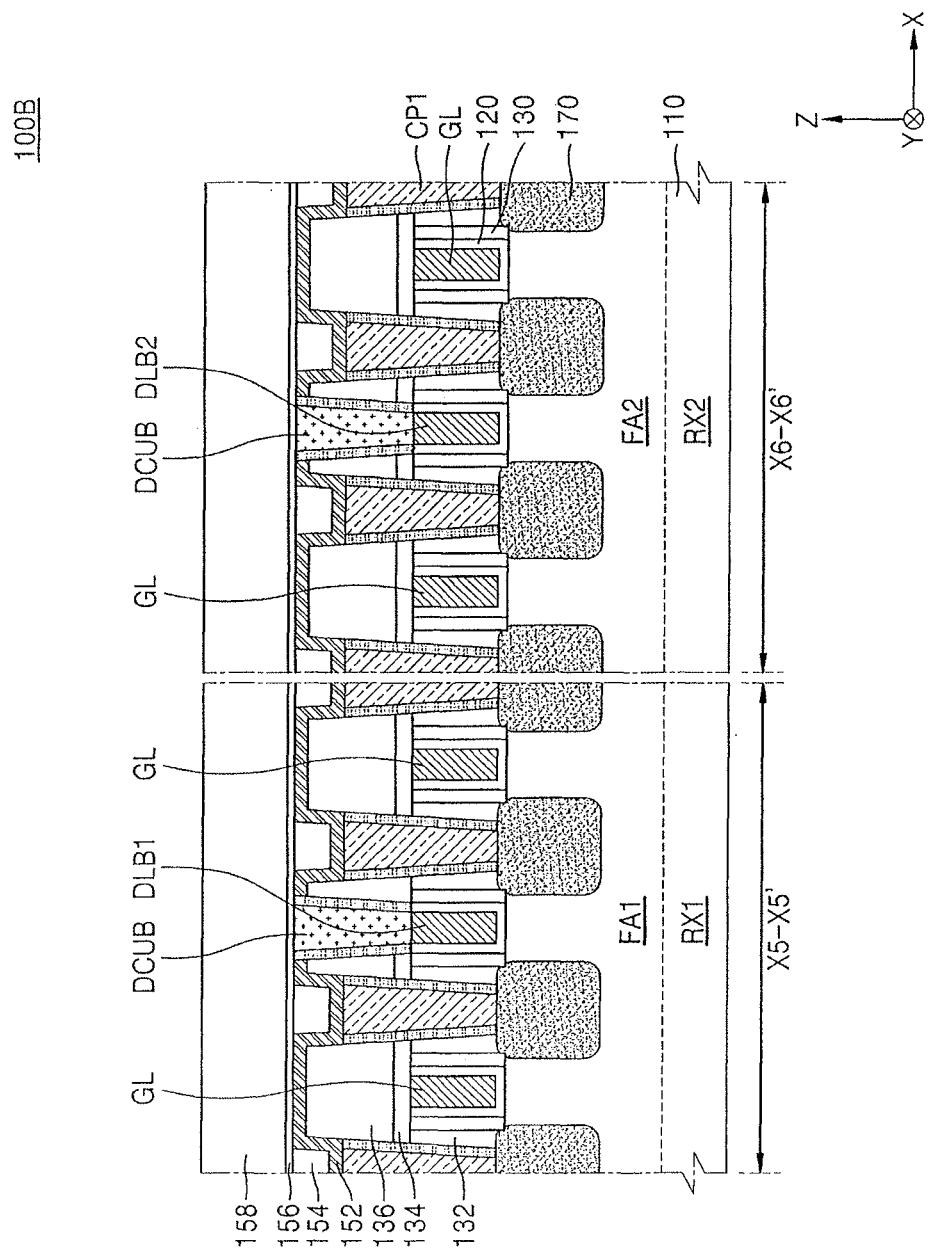
FIG. 7 illustrates a cross-sectional view taken along lines X5-X5' and X6-X6' of the integrated circuit device of FIG. 6.
Figure 8:
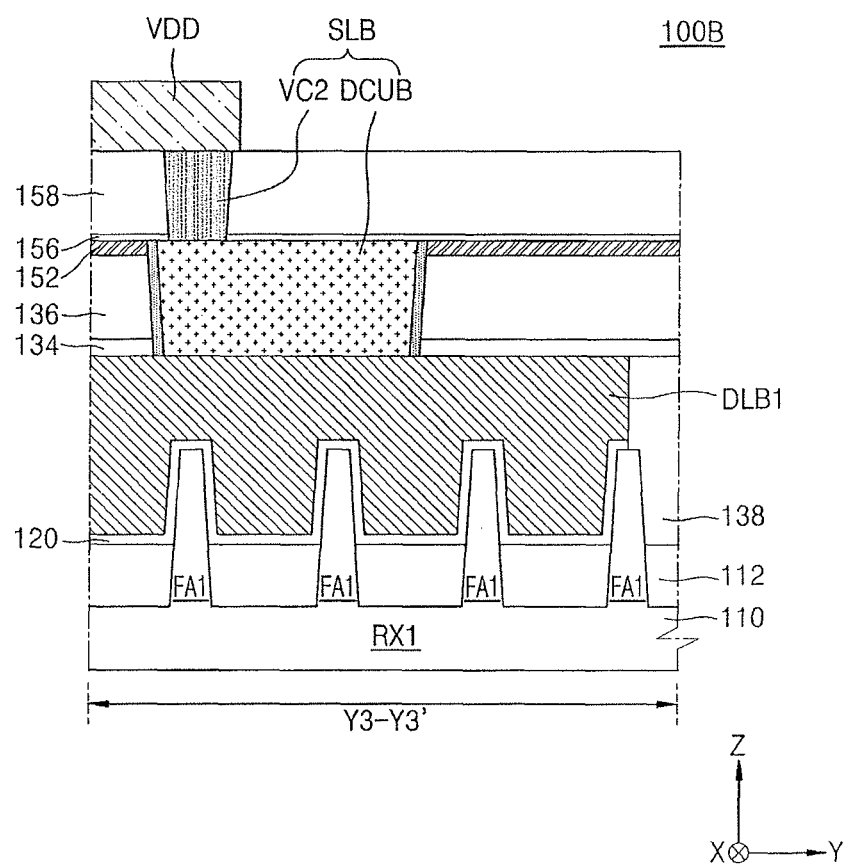
FIG. 8 illustrates a cross-sectional view taken along a line Y3-Y3' of FIG. 6.

FIG. 6 is a layout diagram showing a configuration of an integrated circuit device according to an example embodiment. FIG. 7 is a cross-sectional view taken along lines X5-X5' and X6-X6' of the integrated circuit device of FIG. 6, and FIG. 8 is a cross-sectional view taken along line Y3-Y3' of FIG. 6. In FIGS. 1 to 8, like reference numerals may denote like elements.

An integrated circuit device 100B is similar to the integrated circuit device 100 in FIGS. 1 to 3, except that a first dummy gate line DLB1 and a second dummy gate line DLB2 are formed instead of the pair of first dummy gate lines DL1 and the pair of second dummy gate lines DL2. Therefore, differences between the integrated circuit device 100B and the integrated circuit device 100 will only be described below.

Referring to FIGS. 6 to 8, the integrated circuit device 100B may include the first dummy gate line DLB1 intersecting a first fin active region FA1 and extending in the Y direction, and the second dummy gate line DLB2 intersecting a second fin active region FA2 and extending in the Y direction. The first dummy gate line DLB1 and the second dummy gate line DLB2 may be placed on a straight line and arranged apart from each other in the Y direction by a dummy gate separation region SR.

Device separation structures SLB may be formed to be connected to first and second power lines VDD and VSS on the first and second dummy gate lines DLB1 and DLB2. The device separation structures SLB may include upper dummy contact plugs DCUB, which extend in a direction in which the first and second dummy gate lines DLB1 and DLB2 extend (Y direction), on the first and second dummy gate lines DLB1 and DLB2 and dummy contact vias VC2 arranged on the upper dummy contact plugs DCUB and connected to the first and second power lines VDD and VSS.

The upper dummy contact plugs DCUB and the dummy contact vias VC2 may be arranged to partly overlap at least some portions of the first and second power lines VDD and VSS.

The device separation structures SLB according to another embodiment may be formed on the first and second dummy gate lines DLB1 and DLB2 and extend in a direction in which the first and second dummy gate lines DLB1 and DLB2 extend (Y direction). A width W2 of a device separation structure SLB may be smaller of a pitch of gate lines (or contact pitch CPP). Thus, as the upper dummy contact plugs DCUB are arranged to partly overlap the first and second power lines VDD and VSS, a relatively small area may be used to form each of the device separation structures SLB.

According to the integrated circuit device 100B, an electrical insulation or isolation between cells may be provided by using the device separation structures SLB even though the cells are not physically separated by a fin active region. Also, each of the device separation structures SLB may be formed in a relatively small area to provide the integrated circuit device 100B in a compact manner.

Figure 9:
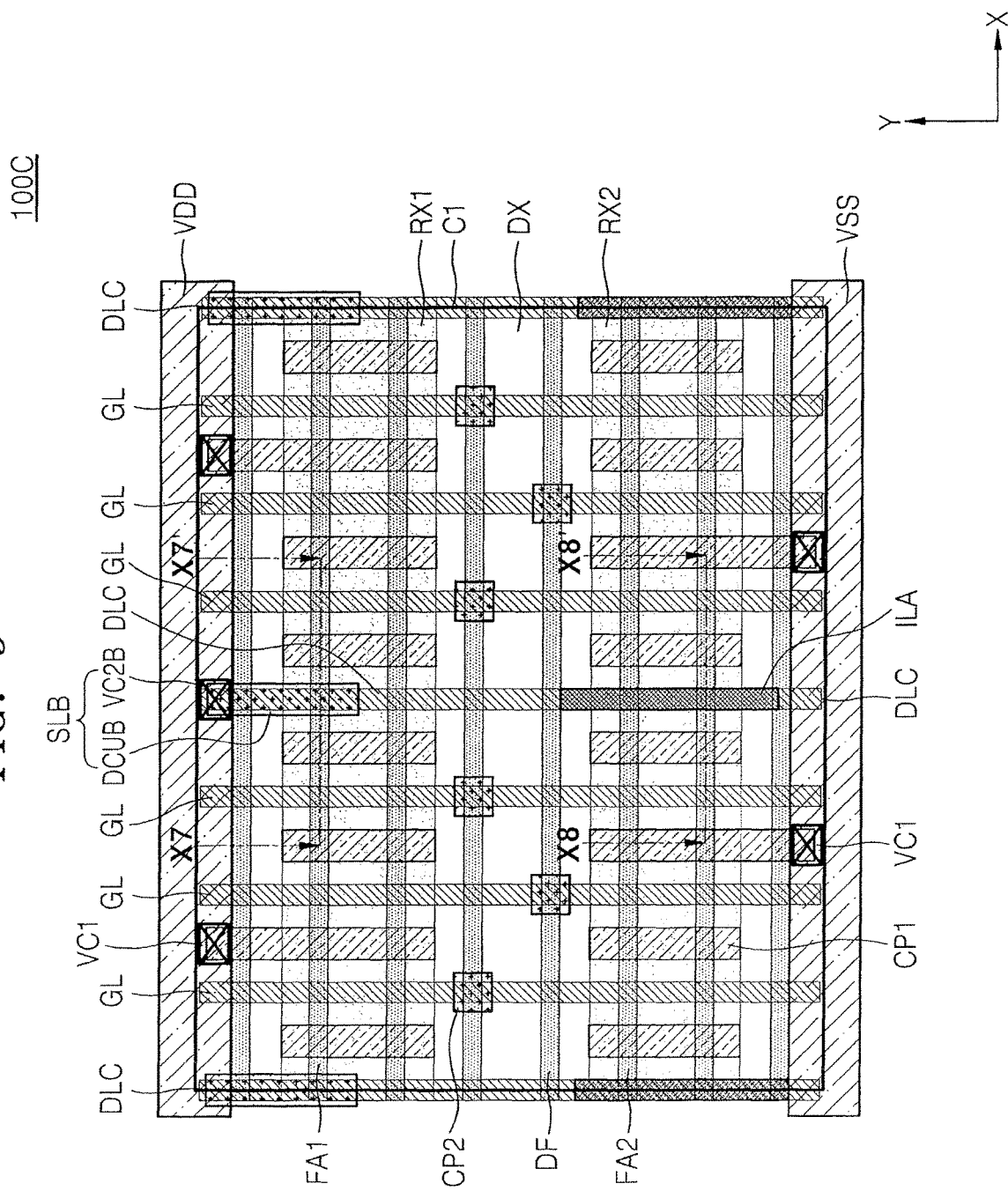
FIG. 9 illustrates a layout diagram showing a configuration of an integrated circuit device according to an example embodiment.
Figure 10:
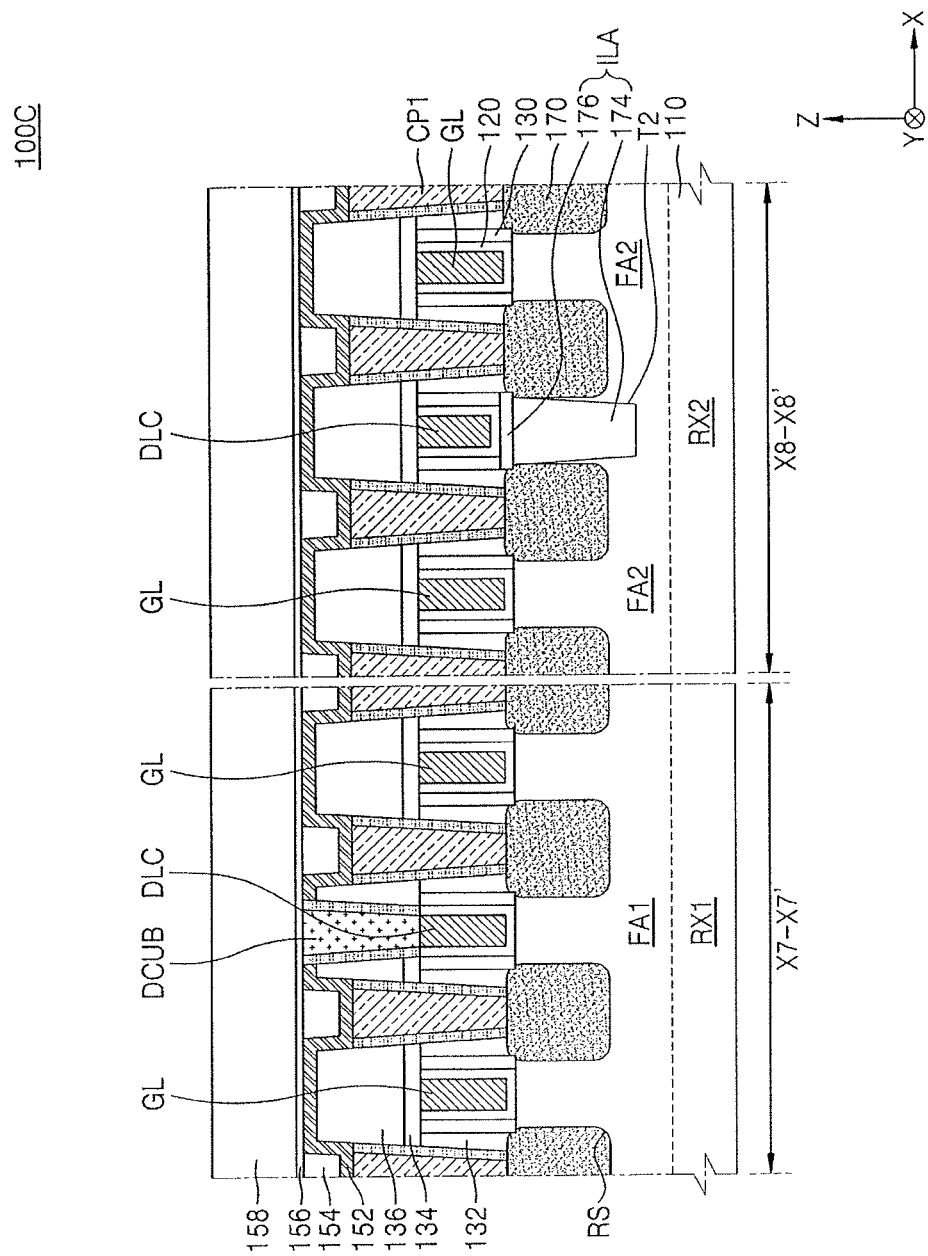
FIG. 10 illustrates a cross-sectional view taken along lines X7-X7' and X8-X8' of the integrated circuit device of FIG. 9.

FIG. 9 is a layout diagram showing a configuration of an integrated circuit device according to an example embodiment. FIG. 10 is a cross-sectional view taken along lines X7-XT and X8-X8' of the integrated circuit device of FIG. 9. In FIGS. 1 to 10, like reference numerals may denote like elements.

An integrated circuit device 100C is similar to the integrated circuit device 100B in FIGS. 6 to 8, except that a device separation structure SLB is only formed on a first active region RX1 and an insulating layer structure ILA is formed on a second active region RX2. Therefore, differences between the integrated circuit device 100C and the integrated circuit device 100B will only be described below.

Referring to FIGS. 9 and 10, the insulating layer structure ILA may be formed on the second active region RX2. The insulating layer structure ILA may be arranged under a dummy gate line DLC and extend to a dummy region DX in a direction in which the dummy gate line DLC extends (Y direction of FIG. 9). In example embodiments, the insulating layer structure ILA may include a lower insulating layer 174 having an upper surface at a lower level than a level of an upper surface of a second fin active region FA2, and an upper insulating layer 176 on the lower insulating layer 174. As illustrated in FIG. 10, the upper insulating layer 176 may have an upper surface at a higher level than a level of the upper surface of the second fin active region FA2.

In an example process for forming the insulating layer structure ILA, a mask having an opening and extending in the Y direction may be formed on the second fin active region FA2, an area of the fin active region FA2 that is exposed by the opening may be removed to form a trench T2 extending in the Y direction and having a predetermined depth, and then the trench T2 may be filled with an insulating material to form the lower insulating layer 174. Next a hard mask having an opening that exposes an upper surface of the lower insulating layer 174 may be formed on the lower insulating layer 174 and the fin active region FA2, the opening may be filled with an insulating material, and then the hard mask may be removed to form the upper insulating layer 176.

In example embodiments, the lower insulating layer 174 and the upper insulating layer 176 may include, for example, an oxide layer formed in a FCVD process or a spin coating process. For example, the lower insulating layer 174 and the upper insulating layer 176 may include FSG, USG, BPSG, PSG, FOX, PE-TEOS, or TOSZ, etc.

Selectively, a liner may further be formed between the second fin active region FA2 and the lower insulating layer 174. In example embodiments, the liner may include, for example, an oxide layer formed in an oxidation process in which a surface of the second fin active region FA2 exposed by the trench T2 is oxidized, and the oxidation process may include, for example, an ISSG process, a heat oxidation process, a UV oxidation process, or an $O_2$ plasma oxidation process.

In example embodiments, a first fin active region FA1 may be a PMOS transistor region and the second fin active region FA2 may be an NMOS transistor region. According to the embodiment described above, an electrical separation structure using the device separation structure SLB may be provided in the first fin active region FA1, which is the PMOS transistor region, and a physical separation structure using the insulating layer structure ILA may be provided in the second fin active region FA2, which is the NMOS transistor region. Thus, the integrated circuit device 100C may present an electrical performance optimized based on a type of a transistor device.

FIGS. 11 to 21 are cross-sectional views illustrating a method of manufacturing an integrated circuit device according to an example embodiment.

The manufacturing method may be a method of manufacturing the integrated circuit device 100 in FIGS. 1 to 3, and FIGS. 11 to 21 show cross-sectional views taken along lines X1-X1' and Y1-Y1' of FIG. 1 in an order of a process. In FIGS. 11 to 21, for the convenience sake, an integrated circuit device 100 formed on a first active region RX1 is only described and descriptions thereof will be provided below in detail. However, unless otherwise mentioned, the descriptions of the integrated circuit device 100 on the first active region RX1 may also be applied to the integrated circuit device 100 formed on a second active region RX2 in a similar manner. In FIGS. 1 to 21, like reference numerals may denote like elements.

Figure 11:
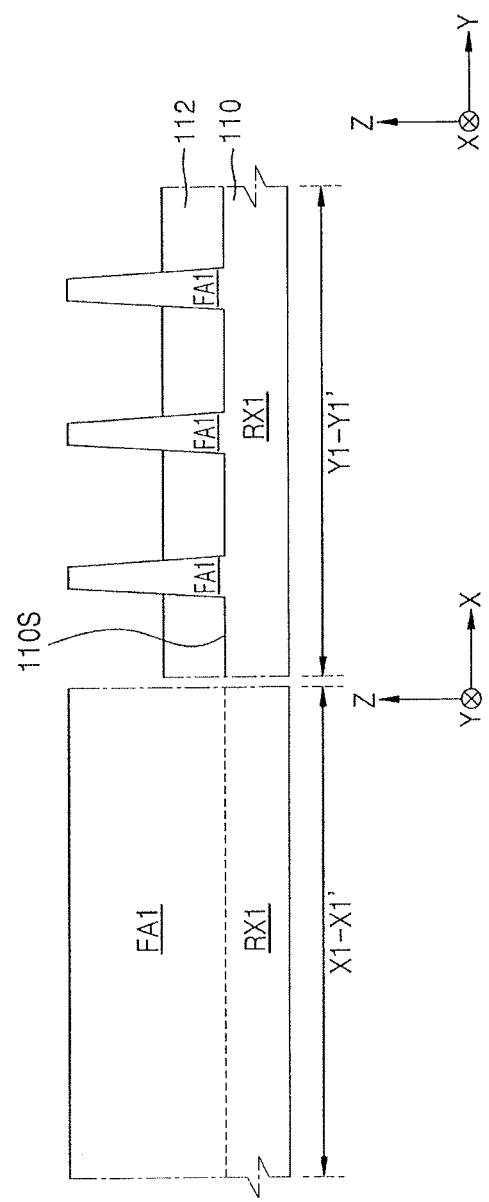
FIGS. 11 to 21 illustrate cross-sectional views illustrating a method of manufacturing an integrated circuit device, according to an example embodiment.

Referring to FIG. 11, portions of a first active region RX1 of a substrate 110 may be etched to form a fin active region FA1 that vertically protrudes from an upper surface 110S of the substrate 110 and extends in one direction.

An isolation layer 112 covering both side walls of the fin active region FA1 may be formed on the substrate 110. In an implementation, an interfacial layer that conformally covers the side walls of the fin active region FA1 may further be formed between the isolation layer 112 and fin active region FA1.

Figure 12:
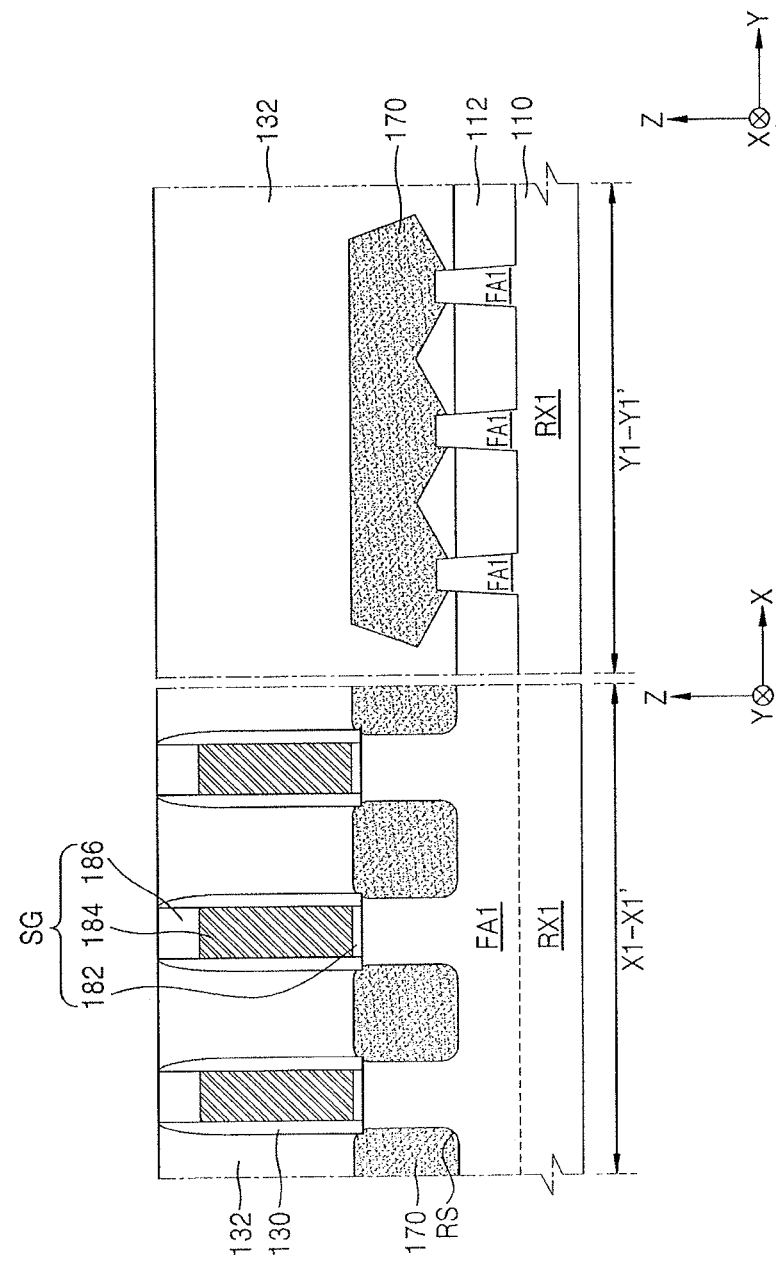

Referring to FIG. 12, a plurality of sacrificial gate structures SG may be formed to extend to intersect the fin active region FA1.

Each of the plurality of sacrificial gate structures SG may include a sacrificial gate insulating layer 182, a sacrificial gate line 184, and a sacrificial gate capping layer 186 that are stacked sequentially on the fin active region FA1. For example, the sacrificial gate insulating layer 182 may include silicon oxide, the sacrificial gate line 184 may include polysilicon, and the sacrificial gate capping layer 186 may include at least one selected from silicon oxide, silicon nitride, and silicon oxynitride.

An insulating spacer 130 may be formed on both side walls of the sacrificial gate structure SG. In an example process for forming the insulating spacer 130, a conformal insulating layer may be formed on the sacrificial gate structure SG and the fin active region FA1 by, for example, an atomic layer deposition (ALD) process or a chemical vapor deposition (CVD) process, and an anisotropic etching process may be performed on the insulating layer to form the insulating spacer 130 on both side walls of the sacrificial gate structure SG.

Some portions of the fin active region FA1 that are exposed on the both side walls of the sacrificial gate structure SG may be etched to form a plurality of recess regions RS, and a semiconductor layer may be formed from the plurality of recess regions RS by an epitaxial process in order to form a plurality source/drain regions 170. Each of the plurality of source/drain regions 170 may have an upper surface at a level higher than a level of an upper surface of the fin active region FA1, for example.

An intergate insulating layer 132 covering the source/drain regions 170, the sacrificial gate structures SG and the insulating spacer 130 may be formed. In an example process for forming the intergate insulating layer 132, an insulating layer covering the source/drain regions 170, the sacrificial gate structures SG and the insulating spacer 130 may be formed, and then a planarization process may be performed on the insulating layer so that an upper surface of the sacrificial gate capping layer 186 is exposed.

Figure 13:
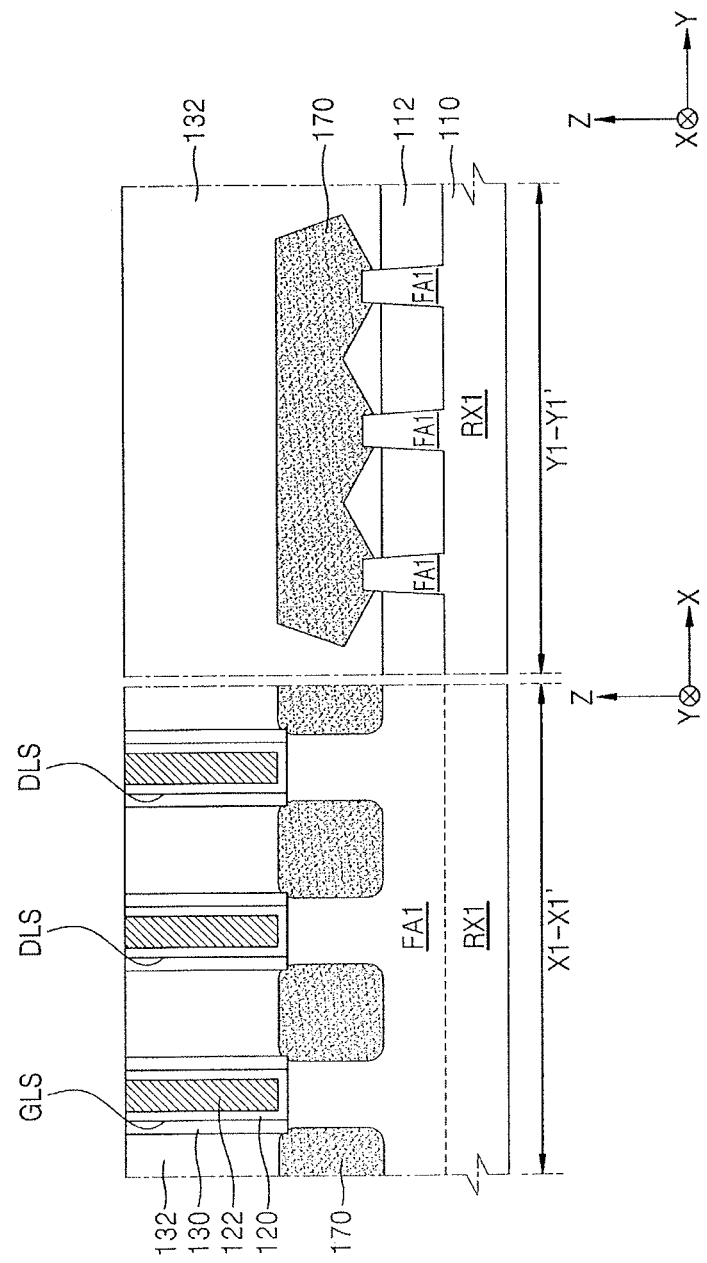

Referring to FIG. 13, the sacrificial gate structures SG (refer to FIG. 12) may be removed to form a plurality of gate spaces GLS and a pair of dummy gate spaces DLS. The insulating spacer 130, the fin active region FA1 and the isolation layer 112 may be exposed through the plurality of gate spaces GLS and the pair of dummy gate spaces DLS.

In example embodiments, a wet etching process may be performed to remove the sacrificial gate structures SG. In the wet etching process, an etching solution including, for example, $HNO_3$, diluted hydrofluoric acid (DHF), $NH_4OH$, tetramethyl ammonium hydroxide (TMAH), KOH, or a combination thereof may be used.

Then, a gate insulating layer 120 and a gate conductive layer 122 may be formed in each of the gate spaces GLS and each of the pair of dummy gate spaces DLS. Each of the gate insulating layer 120 and the gate conductive layer 122 may be formed by, for example, an ALD process, a CVD process, a physical vapor deposition (PVD) process, a metal organic ALD (MOALD) process, or a metal organic CVD (MOCVD) process.

Selectively, before forming the gate insulating layer 120, a process for forming an interfacial layer on a surface of the fin active region FA1 that is exposed by the gate spaces GLS may further be performed. In order to form the interfacial layer, some portions of the fin active region FA1 that are exposed by the gate spaces GLS and the pair of dummy gate spaces DLS may be oxidized.

Figure 14:
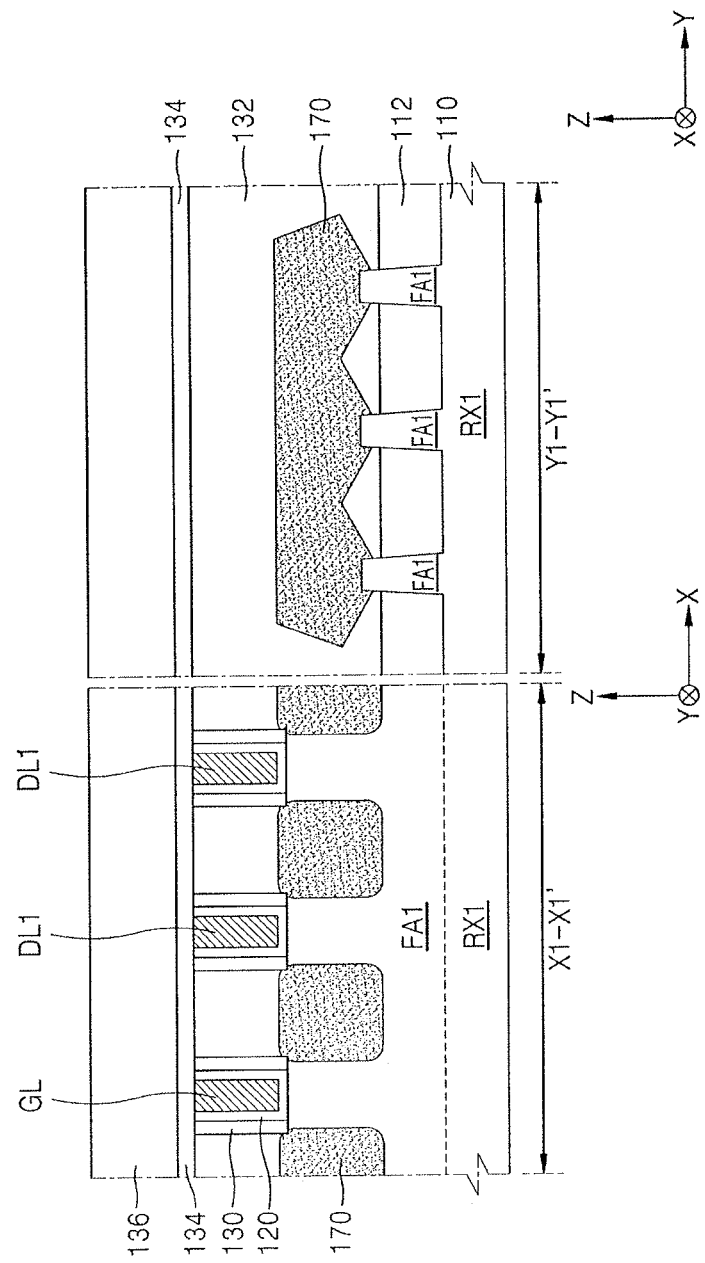

Referring to FIG. 14, as a result of the planarization process, a plurality of gate insulating layers 120 and a plurality of gate lines GL may be formed in the gate spaces GLS (refer to FIG. 13) and a pair of gate insulating layers 120 and a pair of dummy gate lines DL1 may be formed in the pair of dummy gate spaces DLS (refer to FIG. 13).

Then, a mask pattern having an opening that exposes a dummy gate separation region SR may be formed on a result of the planarization process, and the mask pattern may be used as an etch mask to remove the pair of dummy gate lines DL1 exposed in the dummy gate separation region SR to form a pair of first dummy gate lines DL1 and a pair of second dummy gate lines DL2.

Next, an etch stop layer 134 and a first interlayer insulating layer 136 may be formed on the intergate insulating layer 132. Each of the etch stop layer 134 and the first interlayer insulating layer 136 may be formed by, for example, an ALD process, a CVD process, a PVD process, a MOALD process, or a MOCVD process.

Figure 15:
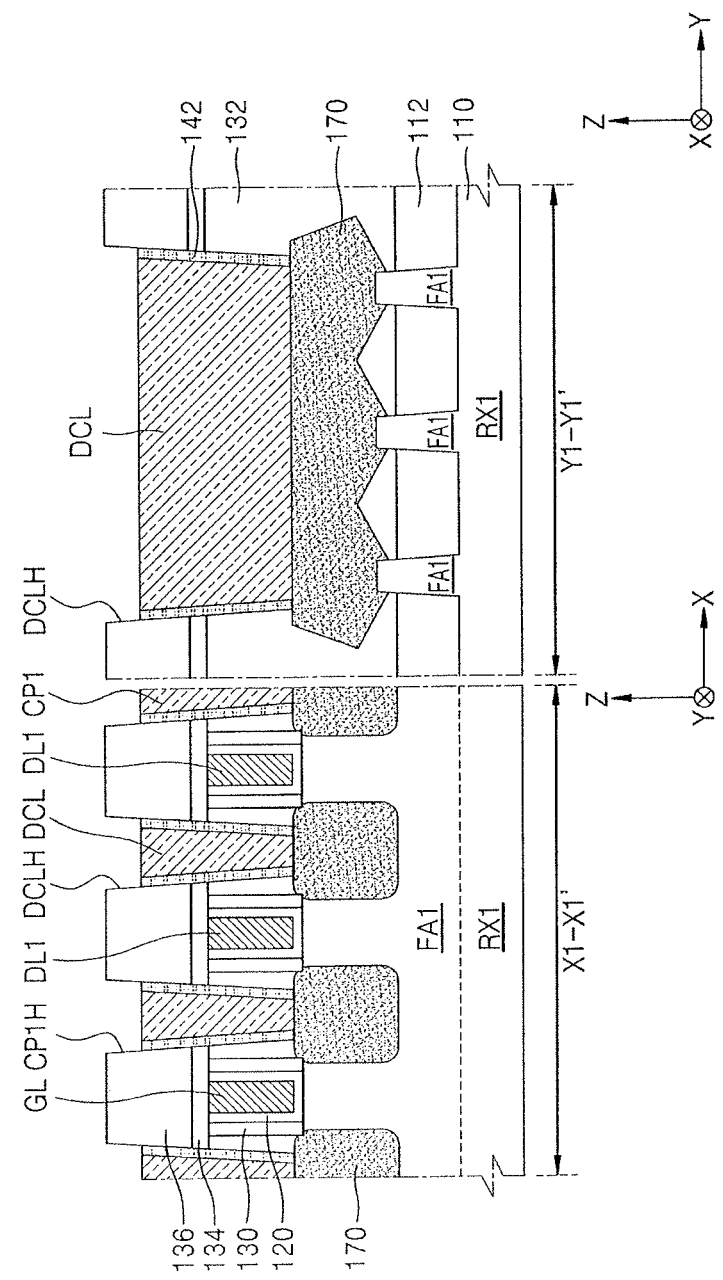

Referring to FIG. 15, a first contact hole CP1H and a lower dummy contact hole DCLH that pass through the first insulating layer 136 and the etch stop layer 134 and expose upper surfaces of the source/drain regions 170 may be formed. The first contact hole CP1H may be formed to expose upper surfaces of source/drain regions 170 disposed at sides of the plurality of gate lines GI, and extend in one direction (Y direction). As illustrated in FIG. 15, the lower dummy contact hole DCLH may be formed to expose an upper surface of a source/drain region 170 disposed between the pair of dummy gate lines DL1.

Then, a metal layer may be formed on upper surfaces of the first insulating layer 136 and the source/drain regions 170 exposed by the first contact hole CP1H and the lower dummy contact hole DCLH, and an anisotropic etching process may be performed on the metal layer to form a barrier layer 142 on side walls of the first contact hole CP1H and the lower dummy contact hole DCLH.

Next, a metal layer filling the first contact hole CP1H and the lower dummy contact hole DCLH may be formed, and an upper portion of the metal layer may be planarized until an upper surface of the first interlayer insulating layer 136 is exposed, thereby respectively forming an active contact plug CP1 and a lower dummy contact plug DCL in the first contact hole CP1H and the lower dummy contact hole DCLH.

Then, the active contact plug CP1 and the lower dummy contact plug DCL may be removed from an upper side by a predetermined thickness by an etch-back process or an anisotropic etching process so that upper surfaces of the active contact plug CP1 and the lower dummy contact plug DCL may have a lower level than a level of an upper surface of the first interlayer insulating layer 136. As a result, upper spaces of the first contact hole CP1H and the lower dummy contact hole DCLH may remain unoccupied.

Figure 16:
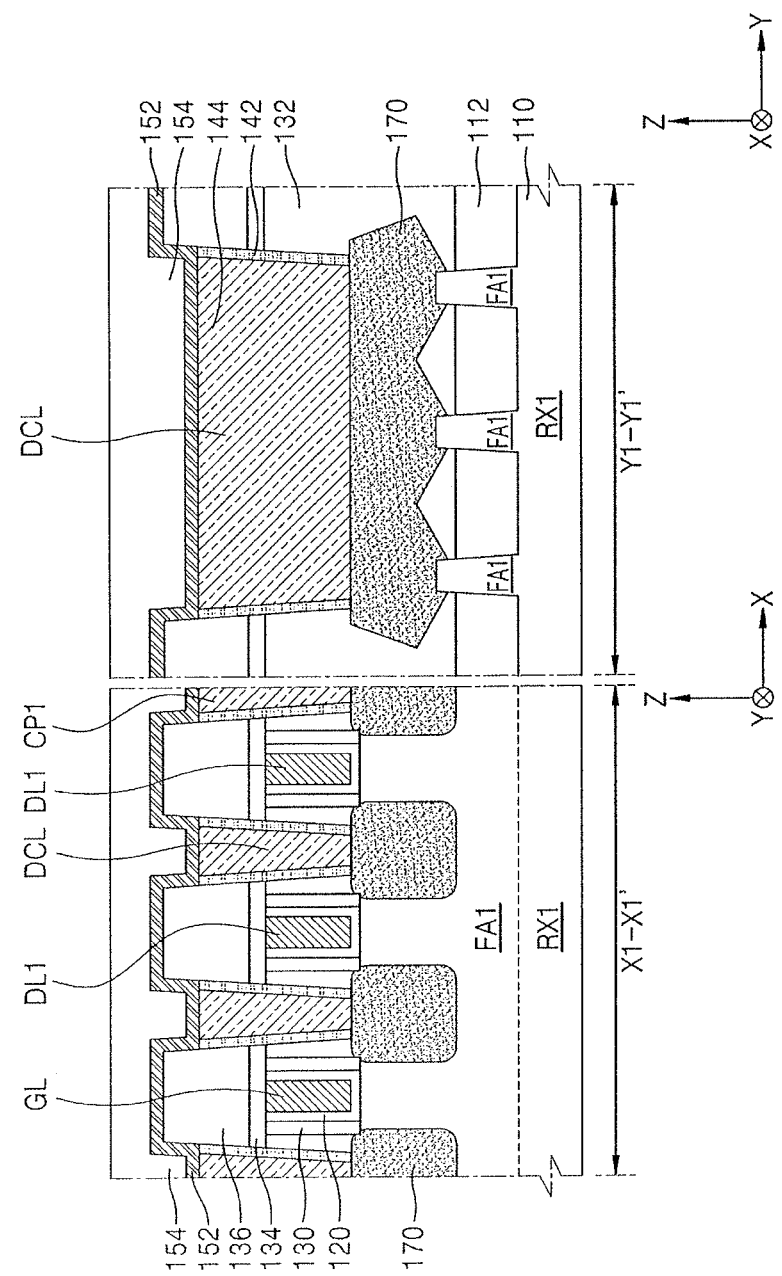

Referring to FIG. 16, an insulating liner 152 that conformally covers the active contact plug CP1, the lower dummy contact plug DCL and the first interlayer insulating layer 136 may be formed. A buried insulating layer 154 may be formed on the insulating liner 152 to fill the upper spaces of the first contact hole CP1H (refer to FIG. 15) and the lower dummy contact hole DCLH (refer to FIG. 15).

A mask pattern may be formed on the buried insulating layer 154, and the insulating liner 152 may be etched by using the mask pattern as an etch mask to form a second contact hole exposing a gate line GL and an upper dummy contact hole DCUH exposing both the pair of dummy gate lines DL1 and the lower dummy contact plug DCL.

Then, a barrier layer 144 may be formed on upper surfaces of the buried insulating layer 154, the gate line GL exposed by the second contact hole, and the pair of dummy gate lines DL1 and the lower dummy contact plug DCL that are exposed by the upper dummy contact hole DCUH.

Figure 17:
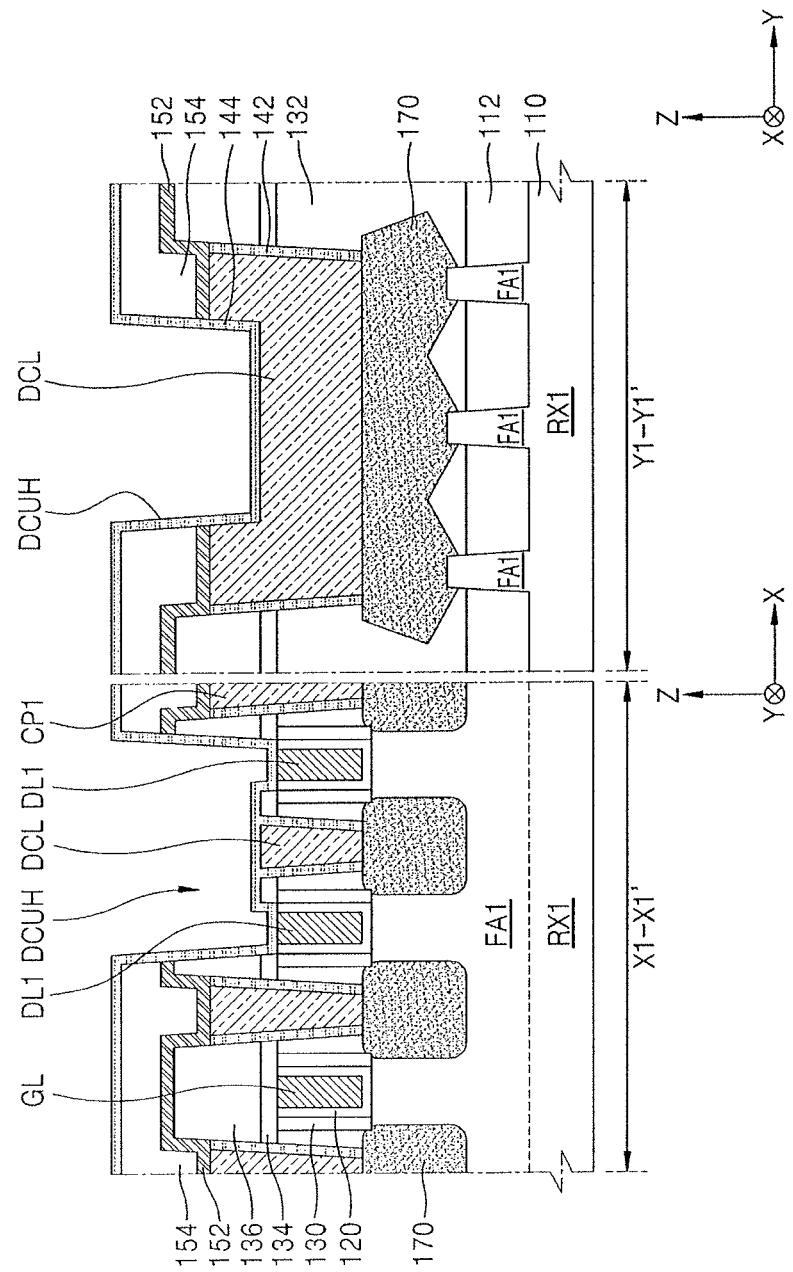
Figure 18:
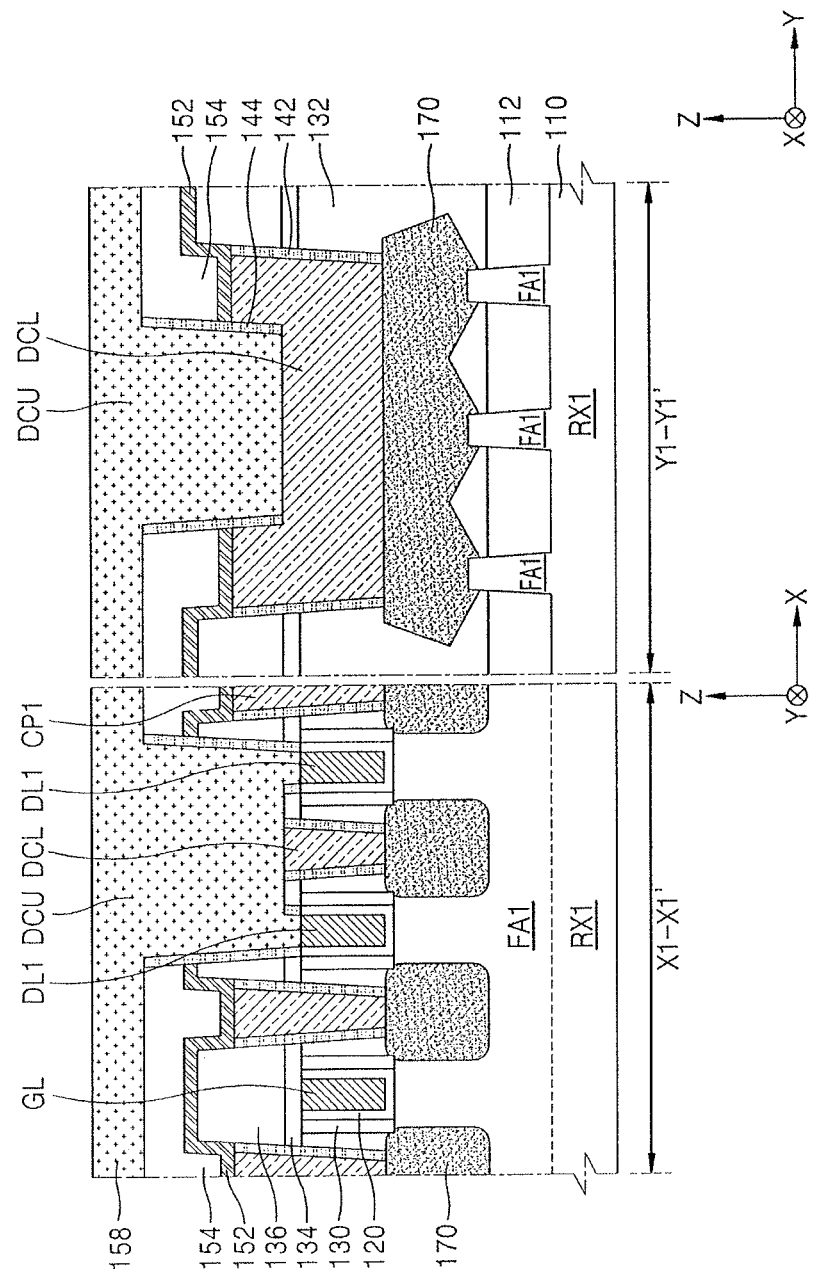

Referring to FIG. 18, an anisotropic etching process may be performed on the barrier layer 144 to form the barrier layer 144 on side walls of the second contact hole and the upper dummy contact hole DCUH (refer to FIG. 17). Next, a conductive layer for forming an upper dummy contact plug DCU may be formed on the buried insulating layer 154 to fill the second contact hole and the upper dummy contact hole DCUH.

Figure 19:
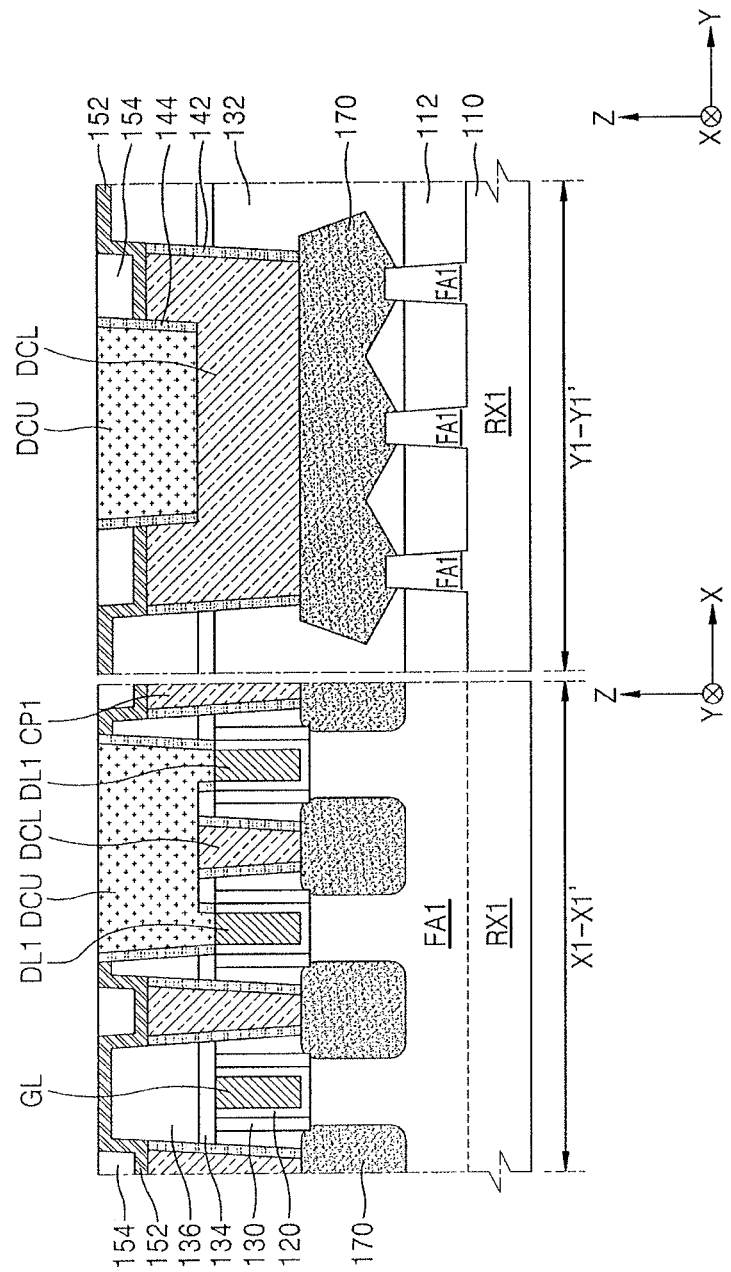

Referring to FIG. 19, a result of a process in FIG. 18 may be planarized until an upper surface of the insulating liner 152 is exposed to form a gate contact plug CP2 (refer to FIG. 3) and the upper dummy contact plug DCU that respectively fill the second contact hole and the upper dummy contact hole DCUH (refer to FIG. 17).

Figure 20:
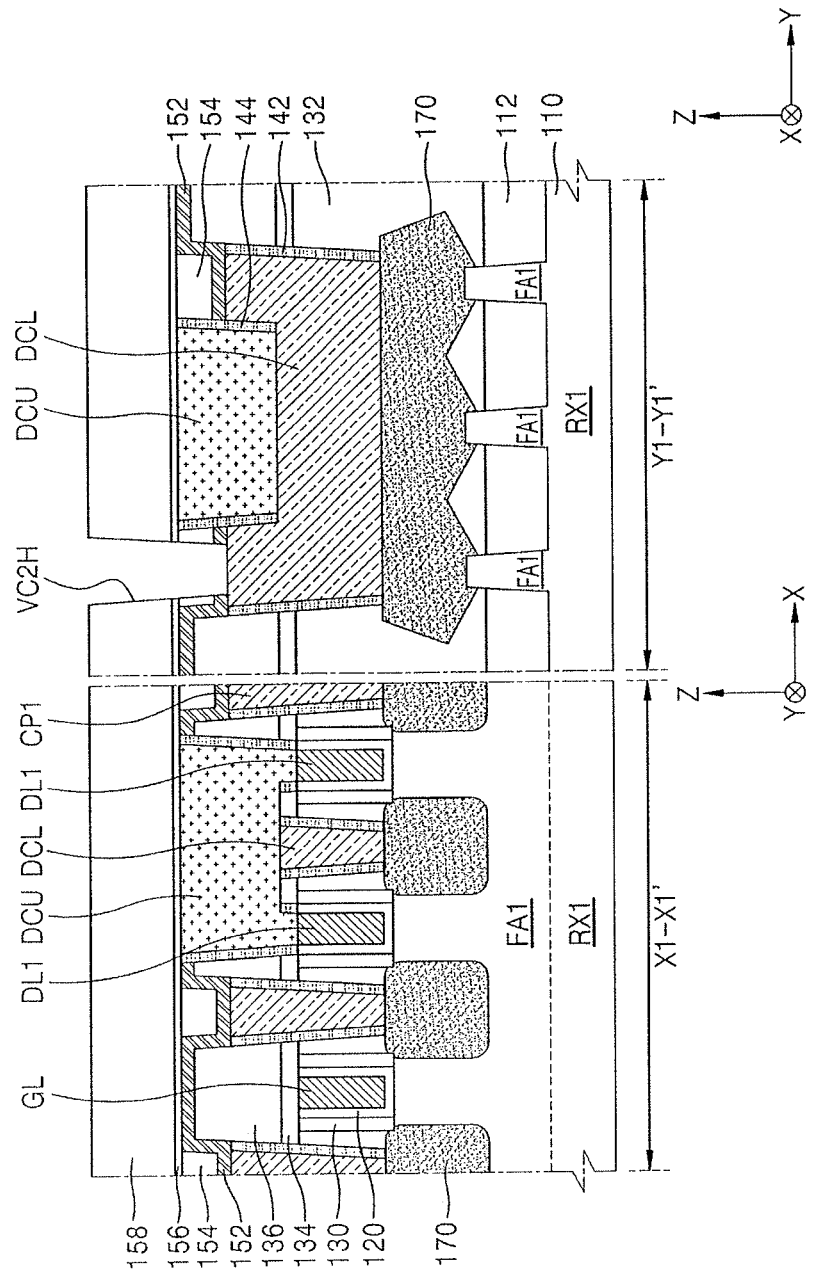

Referring to FIG. 20, a second etch stop layer 156 and a second interlayer insulating layer 158 may be sequentially formed on the insulating liner 152, the gate contact plug CP2 (refer to FIG. 3) and the upper dummy contact plug DCU.

Then, a via hole VC2H that passes through the second etch stop layer 156 and the second interlayer insulating layer 158 and exposes the active contact plug CP1, the gate contact plug CP2 and the upper dummy contact plug DCU may be formed.

Figure 21:
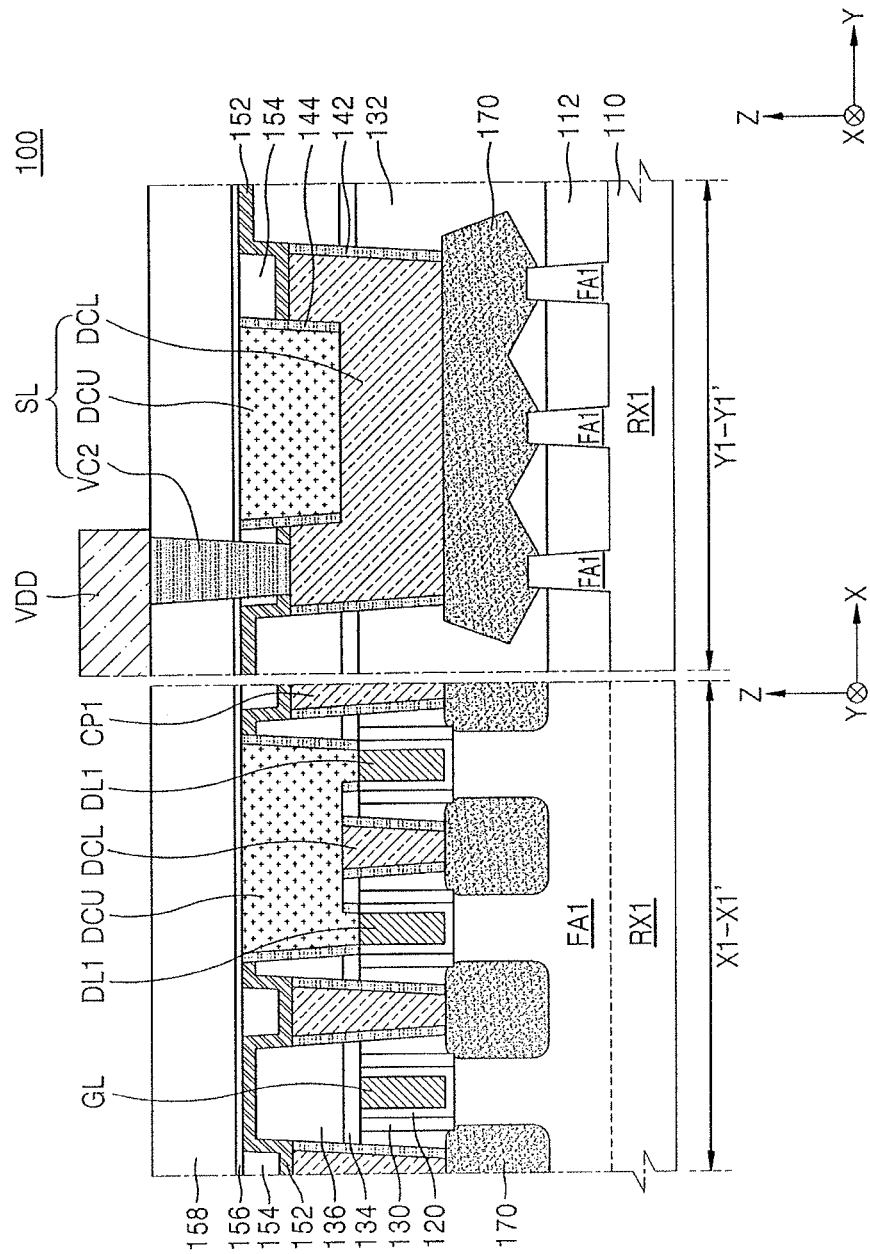

Referring to FIG. 21, an active contact via VC1 (refer to FIG. 1), a gate contact via VC3 (refer to FIG. 3) and a dummy contact via VC2 that fill the via hole VC2H and are respectively connected to the active contact plug CP1, the gate contact plug CP2 and the upper dummy contact plug DCU may be formed.

Then, wiring layers 160 (refer to FIG. 3) that may be respectively and electrically connected to the gate contact via VC3 and the dummy contact via VC2 and a first and second lower lines VDD and VSS may be formed on the second interlayer insulating layer 158. In another embodiment, in a process for forming the gate contact via VC3 and the dummy contact via VC2, the wiring layers 160 and the first and second power lines VDD and VSS may be formed at the same time.

As a result of a method described above, the integrated circuit device 100 may be manufactured.

According to the method of manufacturing the integrated circuit device 100, a patterning process in which a fin active region may be divided into a plurality of fin active regions, each having a reduced length and a process in which an electrically insulating material is filled between the plurality fin active regions may be omitted. Thus, a process of manufacturing of the integrated circuit device 100 may be simplified.

Also, according to the method of manufacturing the integrated circuit device 100, the integrated circuit device 100 having an excellent electrical characteristics and a compact size may be obtained.

Figure 22:
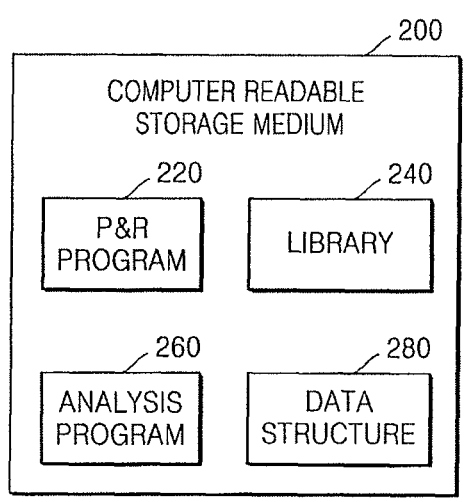
FIG. 22 illustrates a block diagram showing a storage medium according to an example embodiment.

FIG. 22 is a block diagram showing a storage medium 200 according to an example embodiment.

Referring to FIG. 22, the storage medium 200 may include a storage medium readable by a computer, it can be thereafter read by a computer during use to provide commands and/or data to the computer. The computer readable storage medium may include a place and route program 220, a library 240, an analysis program, and a data structure 280. The place and route program 220 may include a plurality of commands to perform a method of designing an integrated circuit by using a standard cell library. For example, the computer readable storage medium 200 may store the place and route program 220 including any commands for designing an integrated circuit by using the standard cell library that includes the cell region C1 described with reference to FIGS. 1 to 21. The library 240 may include information on a standard cell, which is a unit consisting of an integrated circuit. A name of a cell, dimensions, a gate width, a pin, a delay characteristic, a leakage current, a threshold voltage, and functions may be defined in the library 240. The library 240 may include a basic cell such as AND, OR, NOR, and inverter, a complex cells such as OAI (OR/AND/INVERTER), AOI (AND/OR/INVERTER), and a storage element such as a master-slaver flip-flop and a latch. The analysis program 260 may include a plurality of commands for performing a method of analyzing an integrated circuit based on data defining the integrated circuit. The data structure 280 may use the standard cell library included in the library 240, extract marker information from a general standard cell library included in the library 240, or include a storage space for managing data generated in a process of analyzing, by the analysis program 260, characteristics of the integrated circuit the analysis program.

By way of summation and review, as a semiconductor device is downscaled and a device separation structure is formed in a small area, variations or fluctuations in electrical characteristics of a semiconductor device may increase. A device separation structure whereby the electrical characteristics are prevented from varying or degrading even in a small area is desired.

As described above, embodiments may provide an integrated circuit device including a device separation structure that provides stable insulation between cells without a physical separation of a fin active region.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An integrated circuit device, comprising:
    a substrate including first and second fin active regions being parallel to each other and extending in a first direction;
    a gate line intersecting the first and second fin active regions, the gate line extending in a second direction crossing the first direction and parallel to an upper surface of the substrate;
    a first dummy gate line intersecting the first fin active region, the first dummy gate line being spaced apart from the gate line and extending in the second direction;
    a power line extending in the first direction on the substrate; and
    a device separation structure on the first dummy gate line, the device separation structure electrically connecting the power line to the first dummy gate line for a dummy transistor including the first dummy gate line to be turned off, and vertically overlapping a portion of the power line, the device separation structure including:
        an upper dummy contact plug formed on the first dummy gate line; and
        a dummy contact via formed on the upper dummy contact plug and connected to the power line.

2. The integrated circuit device as claimed in claim 1, wherein the upper dummy contact plug extends in the second direction to overlap a portion of the power line.

3. The integrated circuit device as claimed in claim 1, further comprising a second dummy gate line spaced apart from and on a straight line with the first dummy gate line, the second dummy gate line intersecting the second fin active region,
    wherein the first fin active region has an upper surface continuously extending in the first direction under the first dummy gate line, and the second fin active region has an upper surface continuously extending in the first direction under the second dummy gate line.

4. The integrated circuit device as claimed in claim 1, further comprising an insulating layer structure between the first dummy gate line and the second fin active region, the insulating layer structure extending in a direction in which the first dummy gate line extends.

5. The integrated circuit device as claimed in claim 4, wherein:
    the first dummy gate line extends to the second fin active region, and
    the first fin active region has an upper surface continuously extending in the first direction under the first dummy gate line.

6. The integrated circuit device as claimed in claim 1, wherein:
    the first dummy gate line includes a pair of first dummy gate lines that intersect the first fin active region, extend in the second direction, and are arranged apart from each other, and
    the device separation structure includes:
        a lower dummy contact plug disposed between the pair of first dummy gate lines while being spaced apart from the pair of first dummy gate lines and extending in the second direction to overlap a portion of the power line;
        the upper dummy contact plug, which contacts both of the pair of first dummy gate lines and the lower dummy contact plug, the upper dummy contact plug being placed at a higher level than the lower dummy contact plug; and
        the dummy contact via, which is formed on the lower dummy contact plug and is connected to the power line.

7. The integrated circuit device as claimed in claim 6, further comprising an insulating layer structure extending in a direction in which the pair of first dummy gate lines extend between the pair of first dummy gate lines and the second fin active region,
    wherein the pair of first dummy gate lines extend to the second fin active region.

8. An integrated circuit device, comprising:
    a substrate including first and second fin active regions spaced apart on the substrate, the first and second fin active regions having a dummy region therebetween;
    a gate line crossing the first and second fin active regions and the dummy region;
    a dummy gate line spaced apart from the gate line in a first direction, the dummy gate line crossing the first fin active region, the gate line and the dummy gate line extending in a second direction crossing the first direction; and
    a device separation structure electrically connecting a power line to the dummy gate line to control a dummy transistor that includes the dummy gate line, the device separation structure including:
        a lower dummy contact plug separated from the dummy gate line; and
        an upper dummy contact plug contacting both the dummy gate line and the lower dummy contact plug, the upper dummy contact plug being connected to the power line.

9. The integrated circuit device as claimed in claim 8, wherein the upper dummy contact plug vertically overlaps both the dummy gate line and the lower dummy contact plug.

10. The integrated circuit device as claimed in claim 9, wherein the lower dummy contact plug is formed of a conductive material and is laterally separated from the dummy gate line by an insulating spacer.

11. The integrated circuit device as claimed in claim 10, wherein the lower dummy contact plug overlies and contacts a doped source/drain region therebelow.

12. The integrated circuit device as claimed in claim 11, wherein power applied to the power line turns off the dummy transistor.

13. An integrated circuit device, comprising:
- a substrate including first and second fin active regions spaced apart on the substrate, the first and second fin active regions having a dummy region therebetween;
- a gate line crossing the first and second fin active regions and the dummy region;
- a pair of dummy gate lines intersecting the first and second fin active regions, the pair of dummy gate lines being spaced apart from the gate line;
- an insulating layer structure formed between the pair of dummy gate lines and the second fin active region; and
- a device separation structure electrically connecting a power line to the pair of dummy gate lines, the device separation structure including:
  - a lower dummy contact plug formed between the pair of dummy gate lines and on the first fin active region and electrically connected to the power line; and
  - an upper dummy contact plug formed on the lower dummy contact plug and on the pair of dummy gate lines, the upper dummy contact plug electrically connecting the lower dummy contact plug to the pair of dummy gate lines.

14. The integrated circuit device as claimed in claim 13, wherein:
- the first fin active region is a p-type metal-oxide-semiconductor (PMOS) transistor region and a drain voltage Vdd is applied to the device separation structure so that a pair of dummy transistors including the pair of dummy gate lines are turned off, and
- the second fin active region is an n-type metal-oxide-semiconductor (NMOS) transistor region.

15. The integrated circuit device as claimed in claim 13, wherein the insulating layer structure has an upper surface at a lower level than or the same level as a level of an upper surface of the second fin active region.

16. The integrated circuit device as claimed in claim 13, further comprising an insulating liner between the insulating layer structure and the second fin active region.

17. The integrated circuit device as claimed in claim 13, wherein the insulating layer structure vertically overlaps the pair of dummy gate lines.

* * * * *